United States Patent
Lin et al.

(12)

(10) Patent No.: US 9,666,490 B2
(45) Date of Patent: May 30, 2017

(54) MULTI-LAYER SEMICONDUCTOR STRUCTURES FOR FABRICATING INVERTER CHAINS

(71) Applicant: Taiwan Semiconductor Manufacturing Company Limited, Hsinchu (TW)

(72) Inventors: I-Fan Lin, Hsinchu (TW); Yi-Tang Lin, Hsinchu (TW); Cheng-Hung Yeh, Miaoli County (TW); Hsien-Hsin Sean Lee, Duluth, GA (US); Chou-Kun Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/174,021

(22) Filed: Jun. 6, 2016

(65) Prior Publication Data

US 2016/0284603 A1   Sep. 29, 2016

Related U.S. Application Data

(62) Division of application No. 14/135,978, filed on Dec. 20, 2013, now Pat. No. 9,373,623.

(51) Int. Cl.
*H01L 21/8238* (2006.01)
*H01L 27/092* (2006.01)
(Continued)

(52) U.S. Cl.
CPC ............... *H01L 21/823871* (2013.01); *H01L 21/823807* (2013.01); *H01L 21/823814* (2013.01);
(Continued)

(58) Field of Classification Search
CPC ..... H01L 51/56; H01L 27/3244; H01L 33/62; H01L 43/08; H01L 43/02
(Continued)

(56) References Cited

U.S. PATENT DOCUMENTS 6,410,964 B1   6/2002   Shida
8,378,426 B2 *  2/2013   Yasuda ............. H01L 21/76816
                                          257/233
(Continued)

OTHER PUBLICATIONS

Wang, Chien-Hsun et al.; U.S. Appl. No. 14/055,165 Specification: Nanowire Mosfet with Support Structures for Source and Drain; filed Oct. 16, 2013.
(Continued)

*Primary Examiner* — Andy Huynh
(74) *Attorney, Agent, or Firm* — Jones Day

(57) ABSTRACT

Methods for fabricating multiple inverter structures in a multi-layer semiconductor structure are provided. A first device layer is formed on a substrate. The first device layer comprises one or more first inverter structures including a first input terminal and a first output terminal. A second device layer is formed on the first device layer. The second device layer comprises one or more second inverter structures including a second input terminal and a second output terminal. One or more inter-layer connection structures are formed. The one or more inter-layer connection structures are disposed to electrically connect the first input terminal to the second output terminal and electrically connect the first output terminal to the second input terminal.

20 Claims, 51 Drawing Sheets

(51) Int. Cl.
  *H01L 21/84* (2006.01)
  *H01L 29/66* (2006.01)
(52) U.S. Cl.
  CPC ............ *H01L 21/823821* (2013.01); *H01L 21/823828* (2013.01); *H01L 21/823892* (2013.01); *H01L 21/845* (2013.01); *H01L 27/0924* (2013.01); *H01L 29/66545* (2013.01)
(58) Field of Classification Search
  USPC ........................................................ 438/199
  See application file for complete search history.

(56) References Cited

U.S. PATENT DOCUMENTS

| | | | |
|---|---|---|---|
| 2008/0144407 | A1 | 6/2008 | Masleid et al. |
| 2008/0203493 | A1 | 8/2008 | Yasuda |
| 2009/0057722 | A1 | 3/2009 | Masuoka et al. |
| 2009/0146693 | A1 | 6/2009 | Isoda |
| 2010/0194438 | A1 | 8/2010 | Masuoka et al. |
| 2015/0061026 | A1 | 3/2015 | Lin et al. |
| 2015/0129968 | A1* | 5/2015 | Lin ................. H01L 27/1207 257/351 |

OTHER PUBLICATIONS

Wang, Chien-Hsun et al.; U.S. Appl. No. 14/055,165 Drawings: Nanowire Mosfet with Support Structures for Source and Drain; filed Oct. 16, 2013.

Colinge, Jean-Pierre.; U.S. Appl. No. 14/055,229 Specification: Semiconductor-On-Insulator Structure and Method of Fabricating the Same; filed Oct. 16, 2013.

Colinge, Jean-Pierre.; U.S. Appl. No. 14/055,229 Drawings: Semiconductor-On-Insulator Structure and Method of Fabricating the Same; filed Oct. 16, 2013.

* cited by examiner

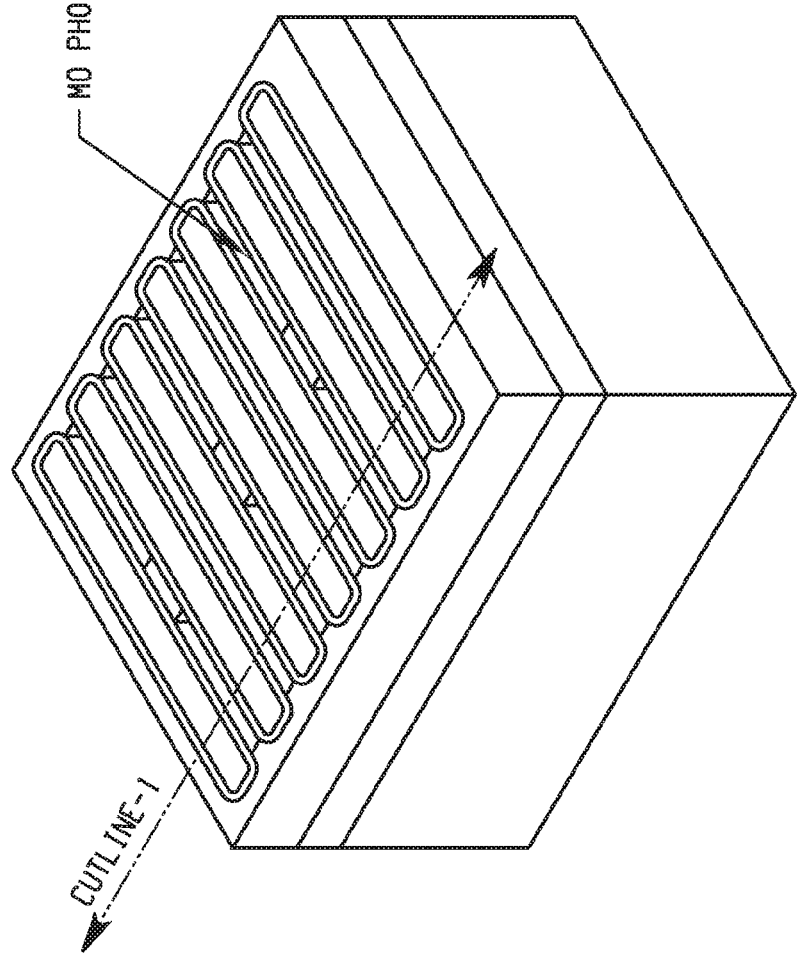
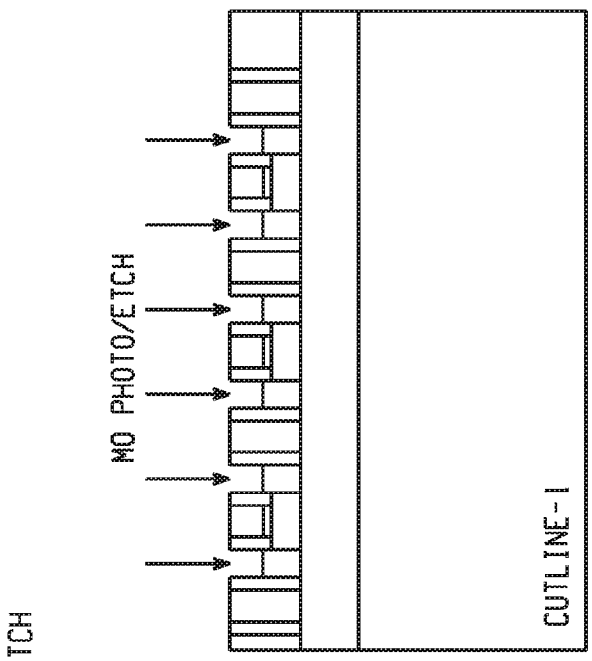
Fig. 10(a)
Fig. 10(b)

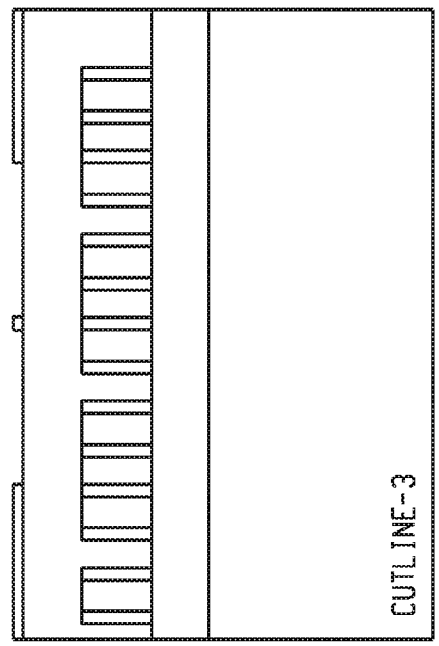
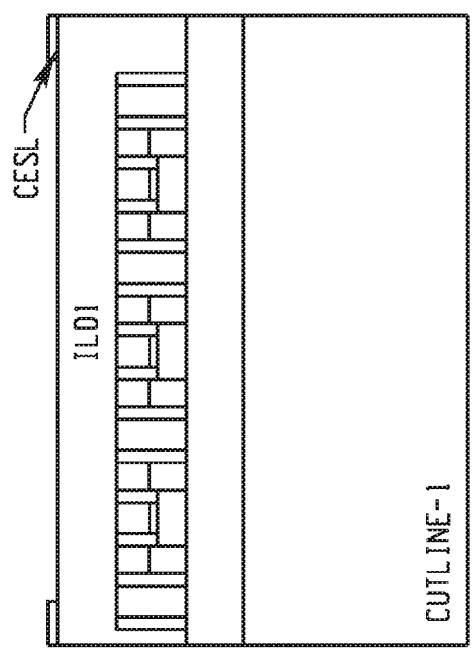
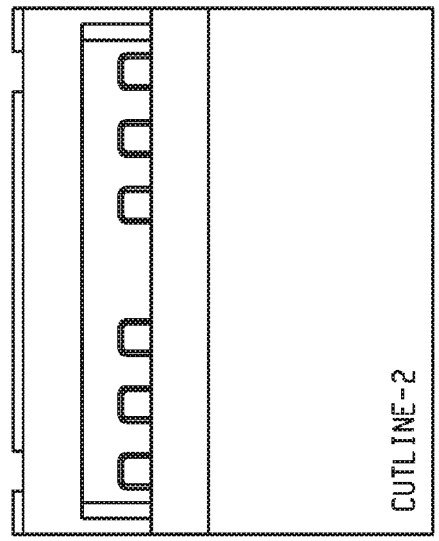
Fig. 14(a)
Fig. 14(b)
Fig. 14(c)

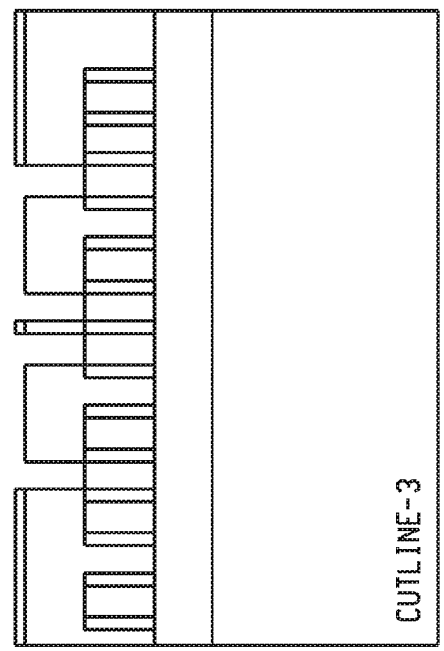
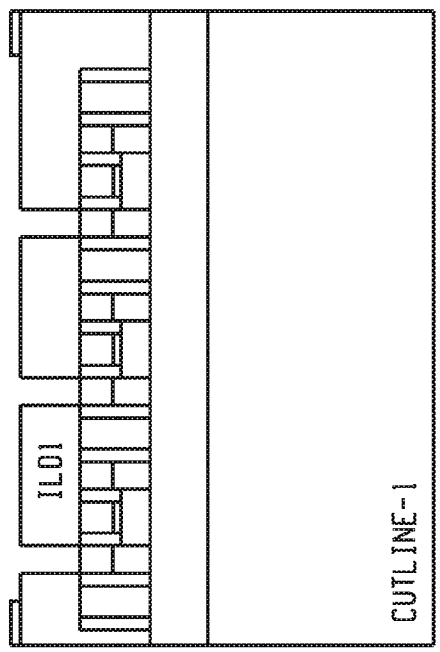
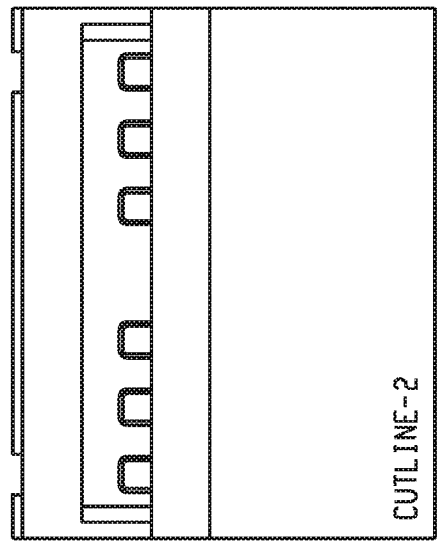
Fig. 18(a)
Fig. 18(b)
Fig. 18(c)

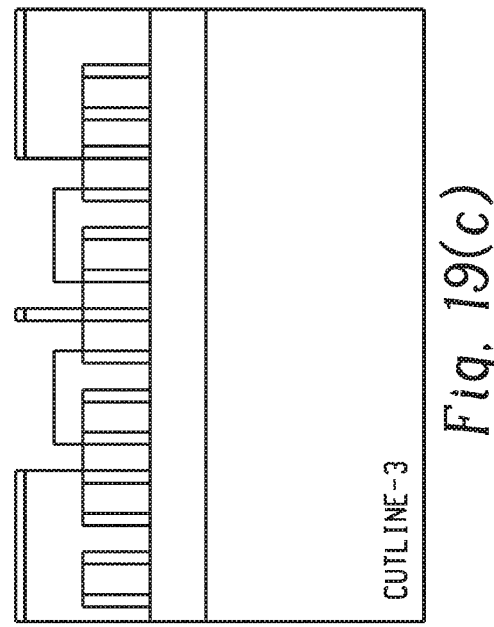
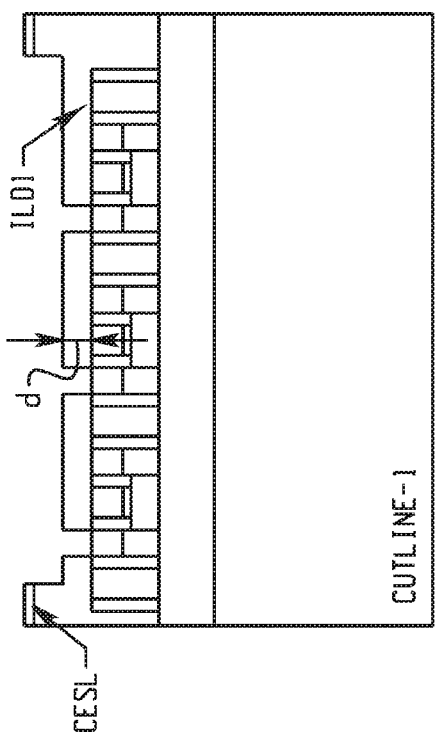
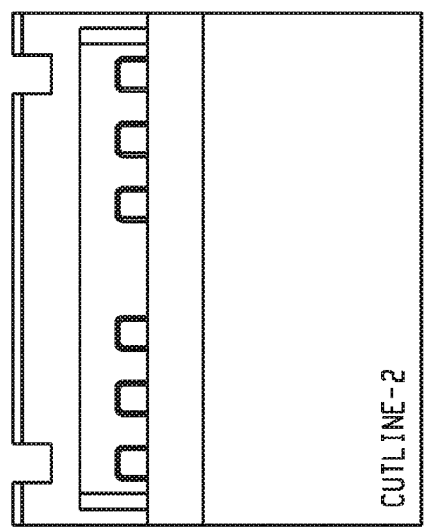
Fig. 19(a)
Fig. 19(b)
Fig. 19(c)

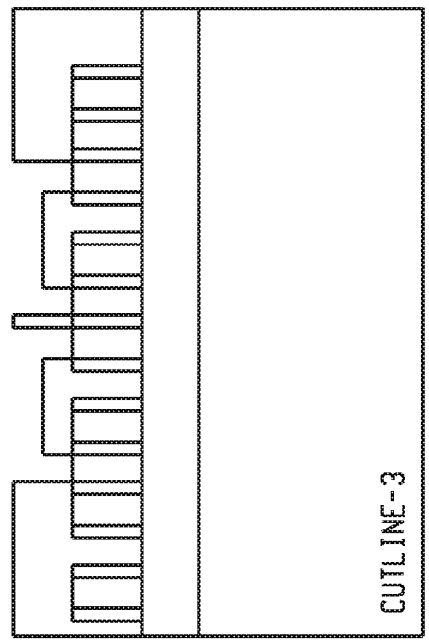
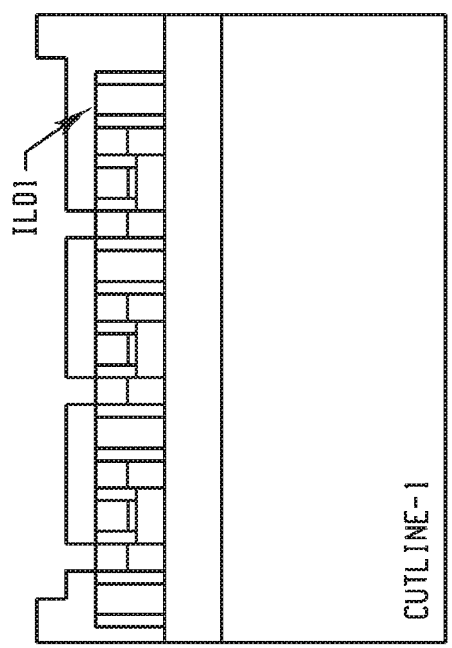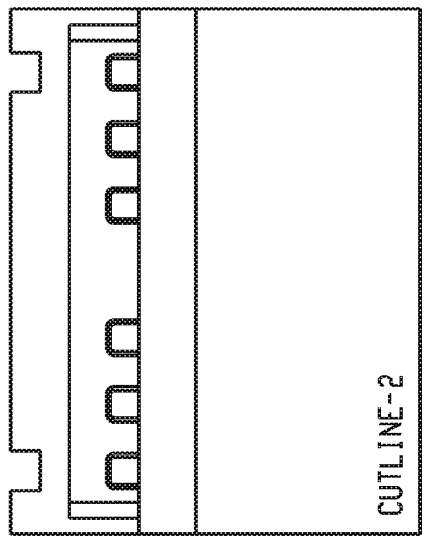

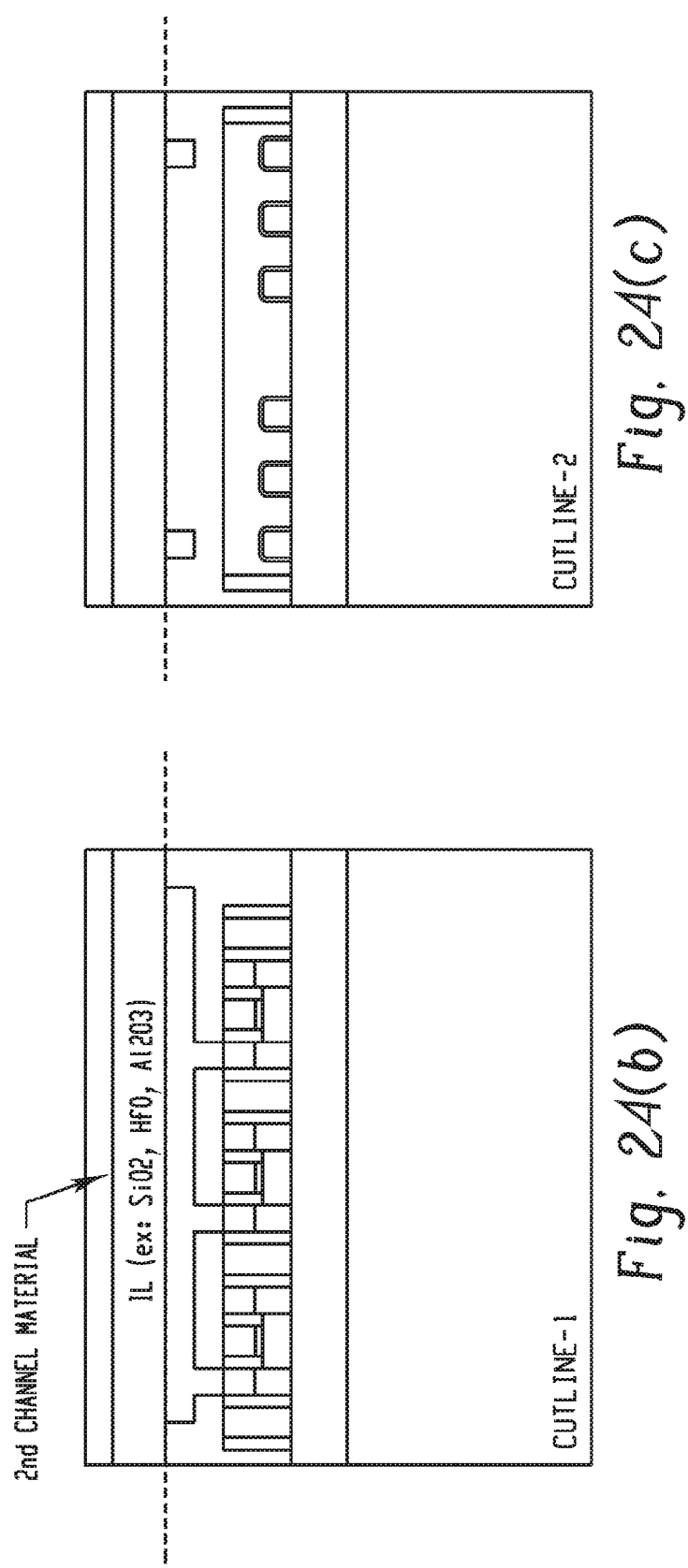

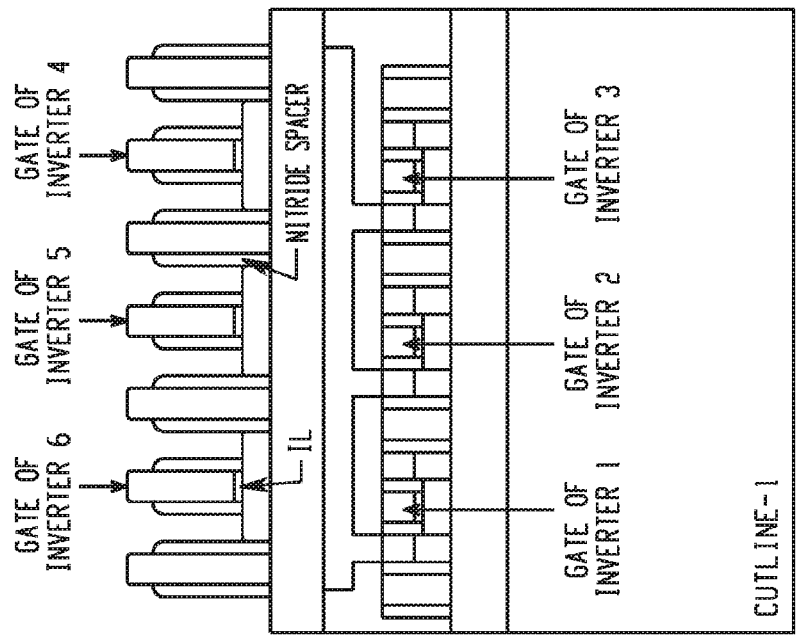
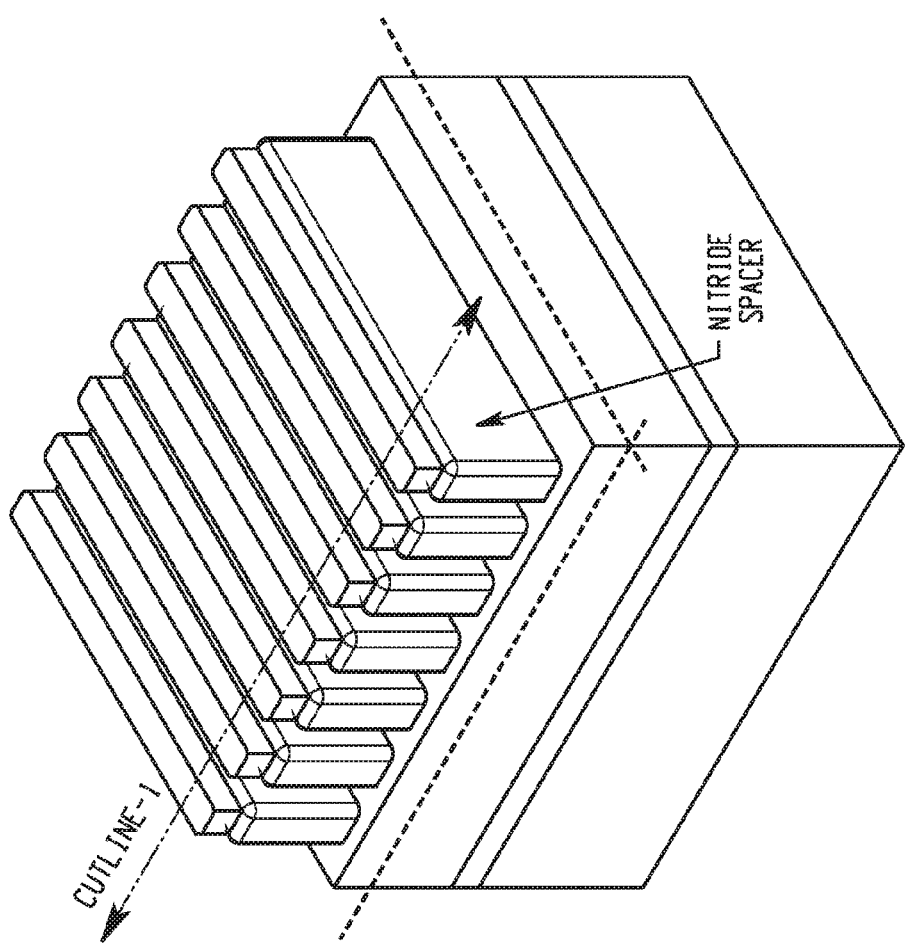
Fig. 28(a)
Fig. 28(b)

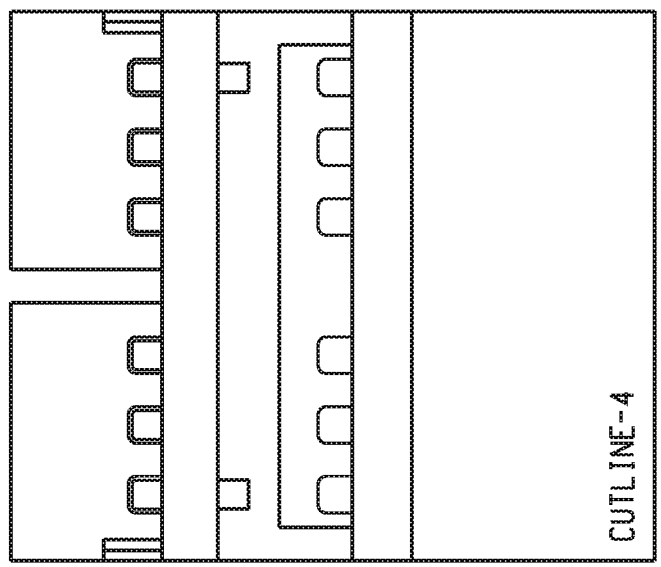
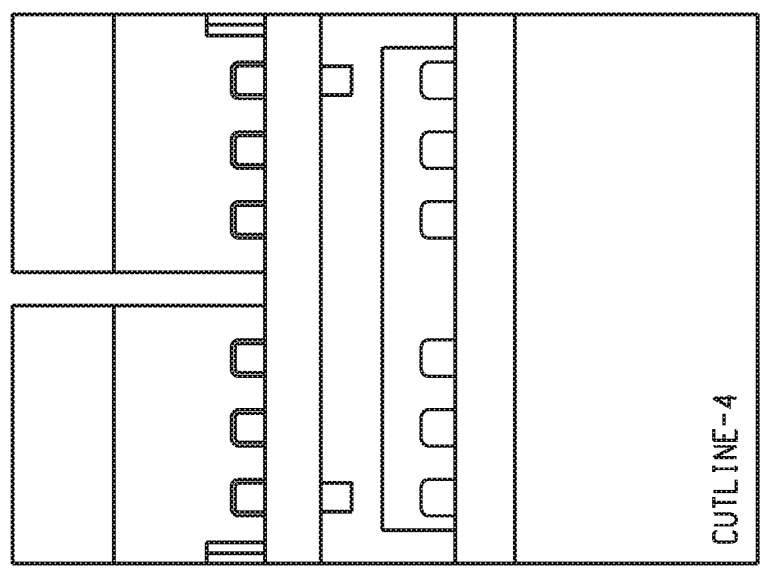

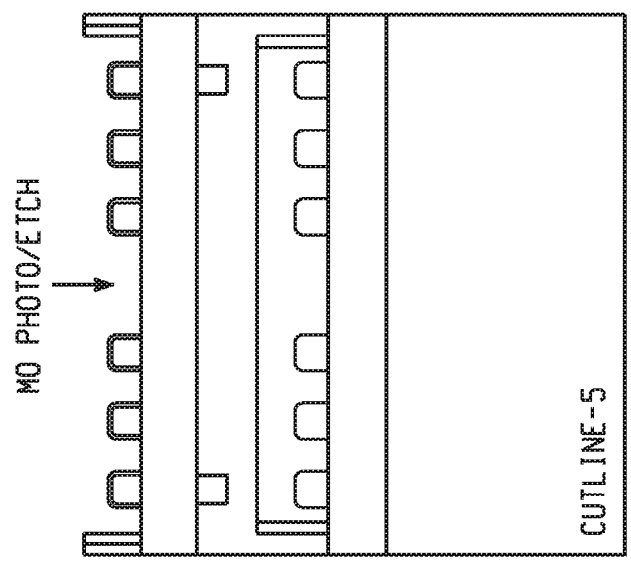
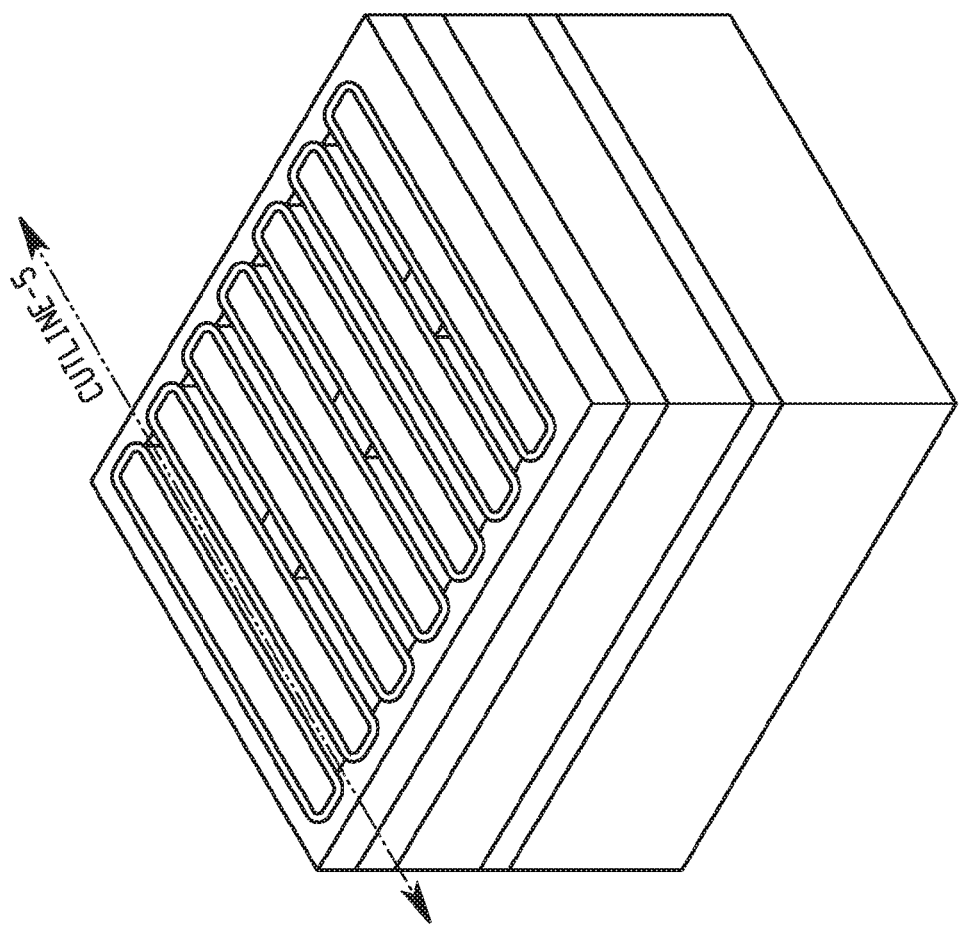
Fig. 37(a)
Fig. 37(b)

MULTI-LAYER SEMICONDUCTOR STRUCTURES FOR FABRICATING INVERTER CHAINS

CROSS-REFERENCE TO RELATED APPLICATIONS

This application is a divisional application of U.S. patent application Ser. No. 14/135,978, entitled "Multi-Layer Semiconductor Structures for Fabricating Inverter Chains," filed Dec. 20, 2013, which is incorporated herein by reference in its entirety.

FIELD

The technology described in this disclosure relates generally to semiconductor structures and more particularly to semiconductor device fabrication.

BACKGROUND

In digital logic, an inverter, i.e., a NOT gate, is a logic gate which implements logical negation. Multiple inverters are often connected to form an inverter chain for different applications, such as a ring oscillator.

SUMMARY

In accordance with the teachings described herein, systems and methods are provided for fabricating a semiconductor structure including an inverter chain. An example semiconductor structure includes a first device layer, a second device layer, and one or more inter-layer connection structures. The first device layer is formed on a substrate and includes one or more first inverter structures. The second device layer is formed on the first device layer and including one or more second inverter structures. The one or more inter-layer connection structures are configured to electrically connect to the first inverter structures and the second inverter structures.

In one embodiment, a method is provided for fabricating multiple inverter structures in a multi-layer semiconductor structure. A first device layer is formed on a substrate, the first device layer including one or more first inverter structures. A second device layer is formed on the first device layer, the second device layer including one or more second inverter structures. One or more inter-layer connection structures are disposed to electrically connect to the first inverter structures and the second inverter structures.

In another embodiment, an inverter chain includes one or more first inverters, one or more second inverters, a first inter-layer connection structure and a second inter-layer connection structure. The one or more first inverters are connected in cascade in a first device layer of a multi-layer semiconductor structure, the first inverters including a first input terminal and a first output terminal. The one or more second inverters are connected in cascade in a second device layer of the multi-layer semiconductor structure, the second inverters including a second input terminal and a second output terminal. The first inter-layer connection structure is configured to electrically connect to the first input terminal and the second output terminal. The second inter-layer connection structure is configured to electrically connect to the second input terminal and the first output terminal.

BRIEF DESCRIPTION OF THE DRAWINGS

FIGS. 3(a)-3(c), 4(a)-4(c), 5(a)-5(c), 6(a)-6(b), 7(a)-7(c), 8(a)-8(c), 9(a)-9(c), 10(a)-10(b), 11(a) -11(c), 12(a)-12(c), 13(a)-13(c), 14(a)-14(c), 15(a)-15(c), 16(a)-16(c), 17(a)-17 (c), 18(a)-18(c), 19(a)-19(c), 20(a)-20(c), 21(a)-21(b), and 22(a)-22(d) depict diagrams showing an example process for fabricating a first device layer of a multi-layer semiconductor structure.

FIGS. 24(a) -24(c), 25, 26(a)-26(c), 27(a)-27(b), 28(a)-28(b), 29(a)-29(c), 30(a)-30(c), 31(a) -31(b), 32(a)-32(b), 33(a)-33(b), 34(a)-34(b), 35, 36(a)-36(b), 37(a)-37(b), 38(a) -38(b), 39(a)-39(b), 40(a)-40(b), 41, 42(a)-42(b), 43(a)-43(c), and 44(a)-44(c) depict diagrams showing an example process for fabricating a second device layer of a multi-layer semiconductor structure.

DETAILED DESCRIPTION

Figure 1:
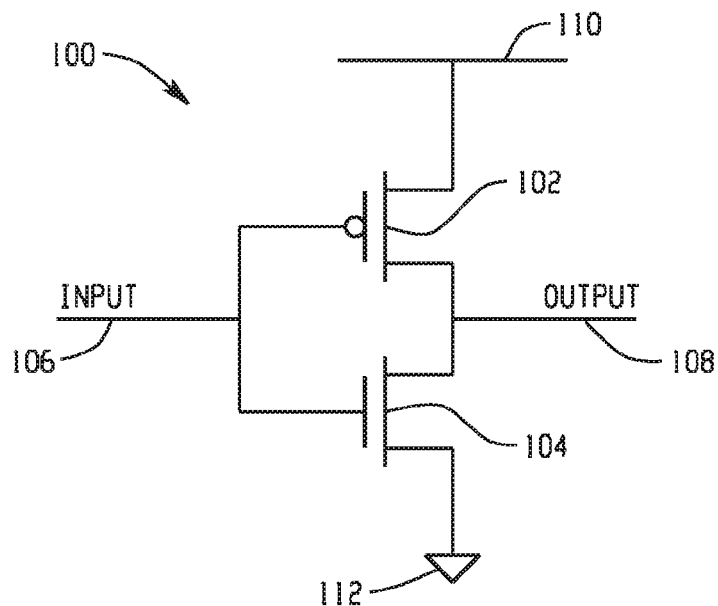
FIG. 1 depicts an example schematic diagram of an inverter.

FIG. 1 depicts an example schematic diagram of an inverter. As shown in FIG. 1, the inverter 100 includes a p-type transistor 102 (e.g., a P-channel MOSFET) and a n-type transistor 104 (e.g., a N-channel MOSFET). The p-type transistor 102 and the n-type transistor 104 each include a gate electrode associated with a gate structure, a source electrode associated with a source region, and a drain electrode associated with a drain region. The gate electrode of the p-type transistor 102 is configured to electrically connect to the gate electrode of the n-type transistor 104 and receive an input signal 106. The drain electrode of the p-type transistor 102 or the drain electrode of the n-type transistor 104 is configured to generate an output signal 108 in response to the input signal 106. The source electrode of the p-type transistor 102 is biased at a predetermined voltage 110 (e.g., VDD), and the source electrode of the n-type transistor 104 is biased at another predetermined voltage 112 (e.g., VSS). For example, the voltage 110 is higher than the voltage 112.

Figure 2:
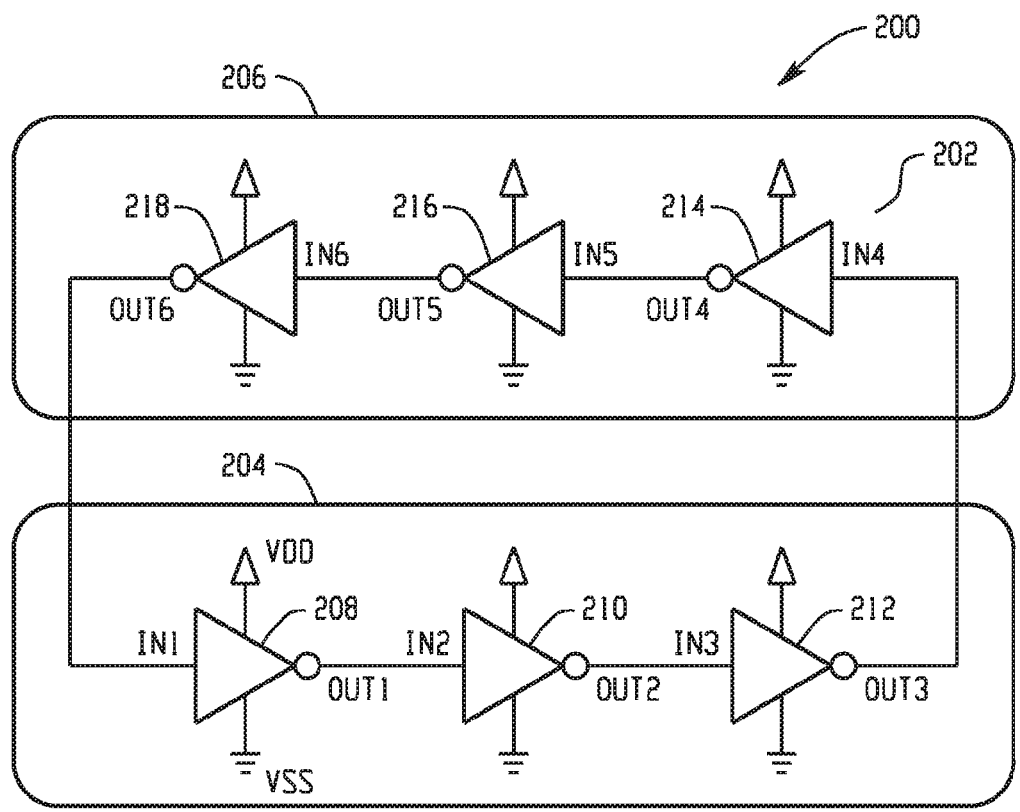
FIG. 2 depicts an example diagram showing an inverter chain fabricated in multiple layers of a semiconductor structure.

FIG. 2 depicts an example diagram showing an inverter chain fabricated in multiple layers of a semiconductor structure. As shown in FIG. 2, the inverter chain 202 that includes six inverters is fabricated in a semiconductor structure 200. Specifically, the semiconductor structure 200 includes two device layers 204 and 206. The inverters 208, 210 and 212 are formed in the first device layer 204, and the inverters 214, 216 and 218 are formed in the second device layer 206. The six inverters are connected in cascade to form the inverter chain 202. Particularly, an input terminal of each inverter is connected to an output terminal of a previous inverter in the chain, and an output terminal of each inverter is connected to an input terminal of a next inverter in the chain. In some embodiments, the inverter chain 202 includes multiple inverters (e.g., more than or less than six inverters) formed in the two device layers 204 and 206. In certain embodiments, the semiconductor structure 200 includes multiple layers (e.g., more than two layers) for fabricating the inverter chain 202. As an example, each inverter includes a n-type transistor (e.g., n-MOSFET) and a p-type transistor (e.g., p-MOSFET), similar to the inverter 100.

Figure 3B:
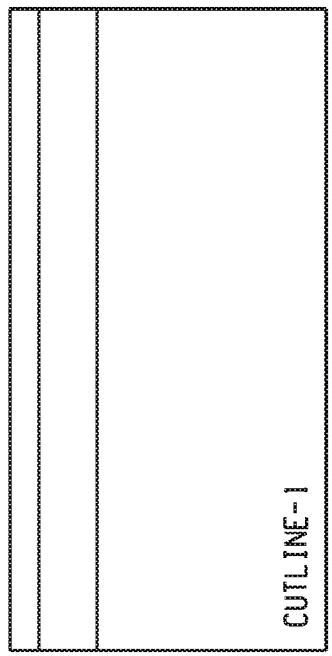
Figure 3C:
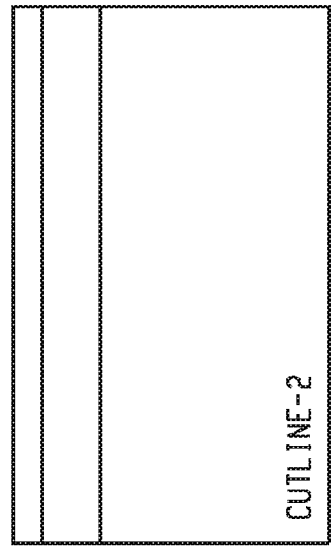
Figure 3A:
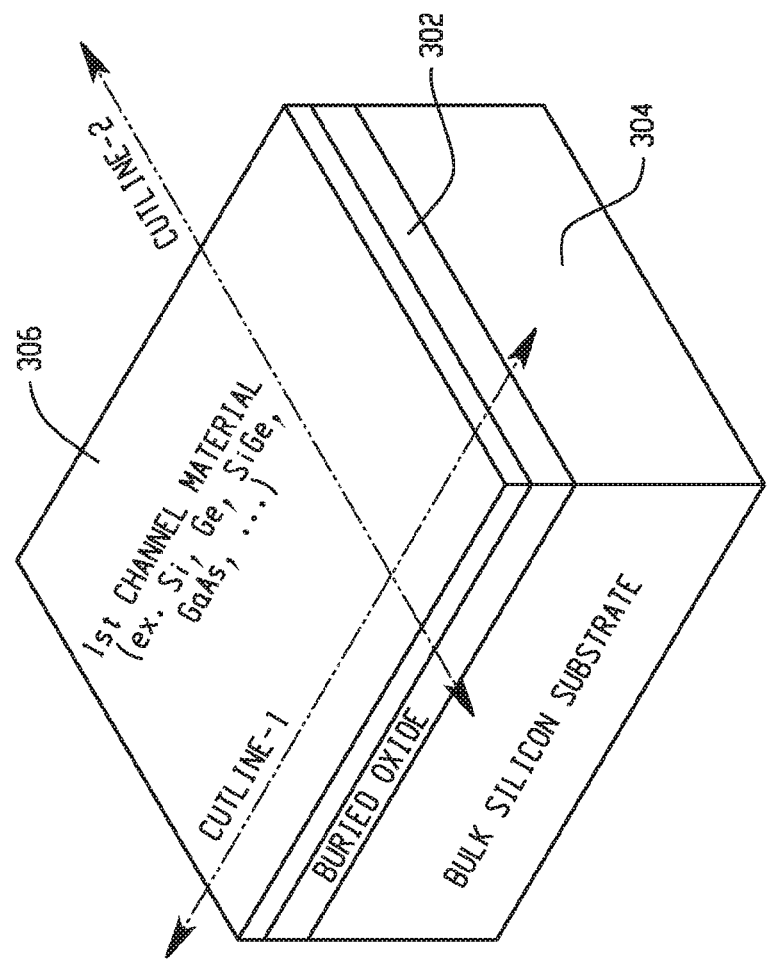

FIG. 3(a)-FIG. 22(d) depict diagrams showing an example process for fabricating the first device layer 204 of the multi-layer semiconductor structure 200. As shown in FIG. 3(a), a semiconductor-on-insulator (SOI) wafer is used for fabricating the multi-layer semiconductor structure 200. A buried oxide layer 302 is formed on a bulk silicon substrate 304, and one or more layers of channel material layer 306 are formed on the buried oxide layer 302. For example, the channel material layer 306 includes silicon, germanium, silicon germanium, gallium arsenide, or other suitable materials. FIG. 3(b) and FIG. 3(c) depict cross-sectional views along two cutlines "cutline-1" and "cutline-2" respectively for the structure shown in FIG. 3(a).

Figure 4B:
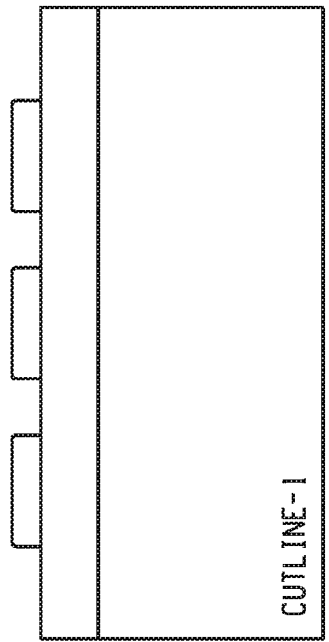
Figure 4C:
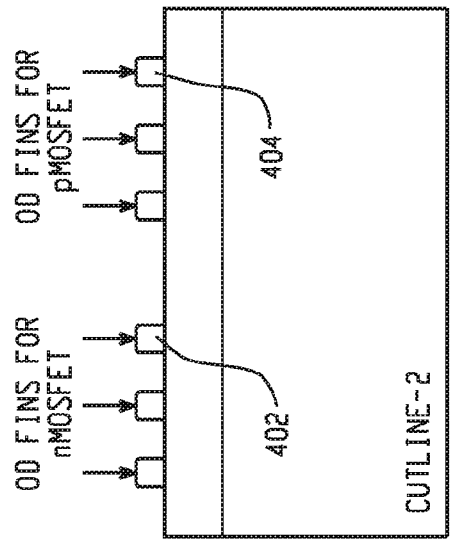
Figure 4A:
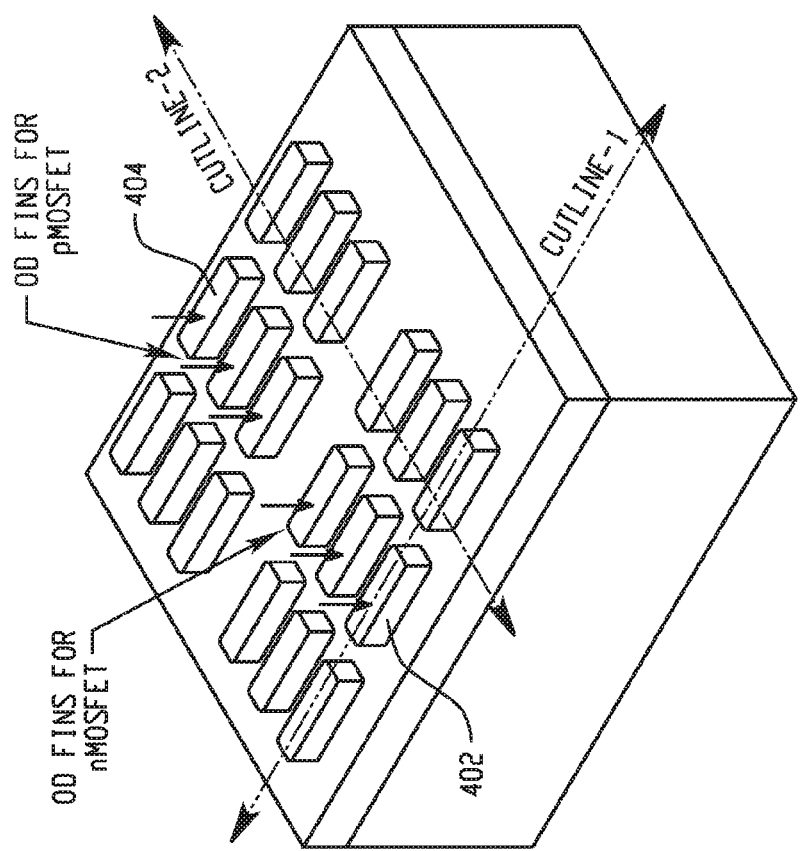
Figure 5B:
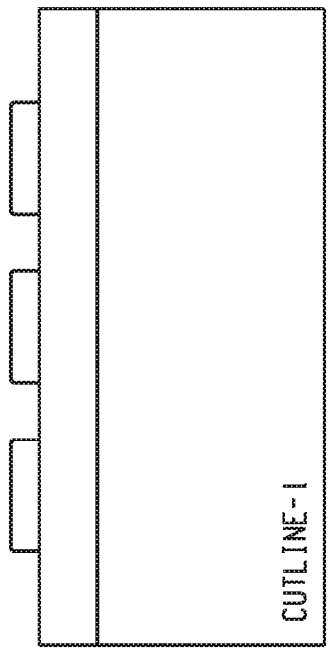
Figure 5C:
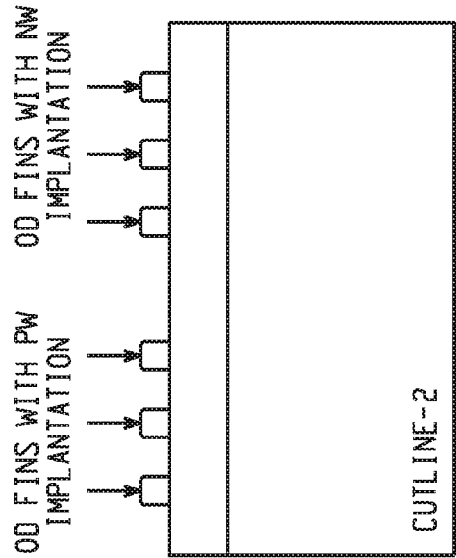
Figure 5A:
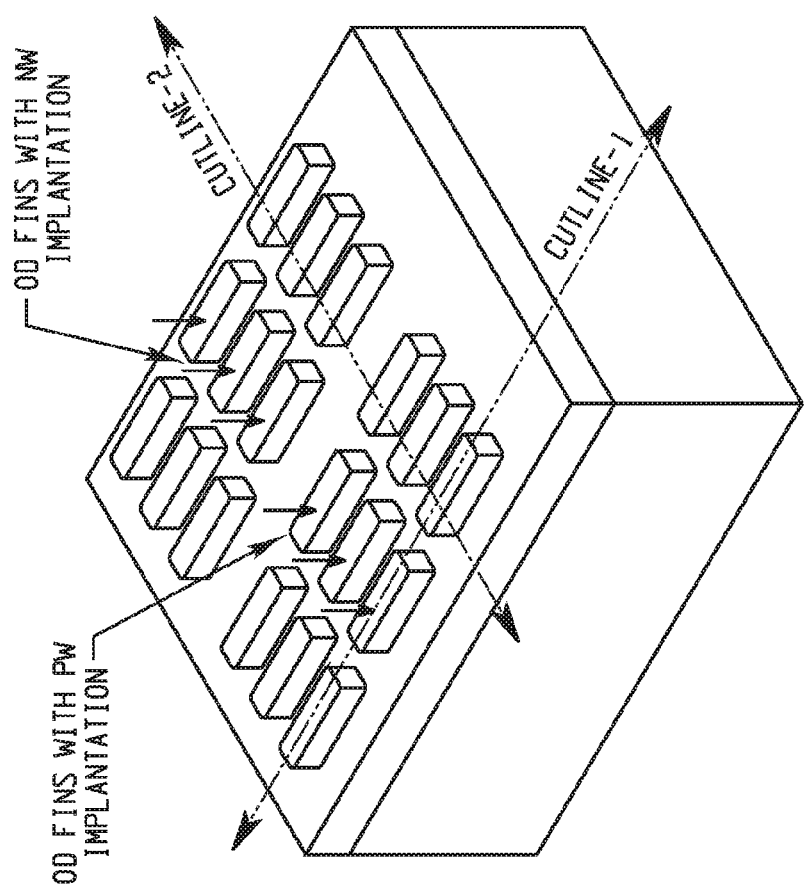

As shown in FIG. 4(a), a number of fin structures are formed in the channel material layer 306 through photolithography and etching (e.g., dry etching or wet etching) on the SOI wafer. For example, one or more fin structures 402 are formed to be active regions of n-type transistors (e.g., n-channel MOSFETs), and one or more fin structures 404 are formed to be active regions of p-type transistors (e.g., p-channel MOSFETs). FIG. 4(b) and FIG. 4(c) depict cross-sectional views along the cutlines "cutline-1" and "cutline-2" respectively for the structure shown in FIG. 4(a). Then, well implantation is performed on the fin structures 402 and 404, as shown FIG. 5(a), and cross-sectional views along the cutlines "cutline-1" and "cutline-2" are shown in FIG. 5(b) and FIG. 5(c) respectively. As an example, a high-temperature annealing (e.g., at about 1000° C. for 10 seconds) follows to reduce defects and activate dopants.

Figure 6B:
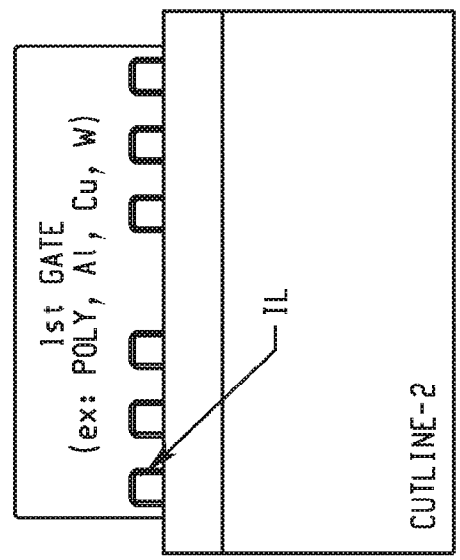
Figure 6A:
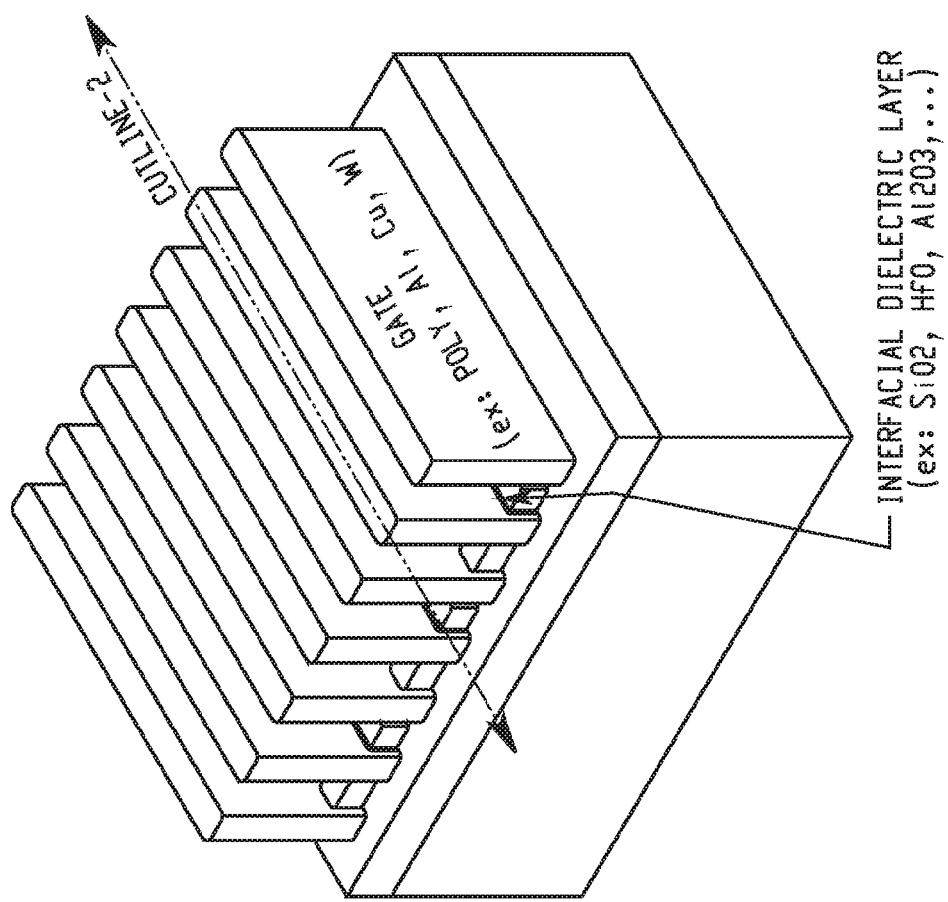

An interfacial dielectric layer is formed on the fin structures, and a gate-structure layer is deposited and planarized, e.g., through chemical mechanical planarization/polishing (CMP). The gate-structure layer is then patterned through photolithography and etching (e.g., dry etching, wet etching), and the interfacial dielectric layer is etched, as shown in FIG. 6(a). A cross-sectional view along the cutline "cutline-2" is shown in FIG. 6(b). For example, the interfacial dielectric layer includes silicon oxide, hafnium oxide, aluminum oxide, or other suitable materials. The gate-structure layer includes polysilicon, aluminum, copper, tungsten, or other suitable materials. In some embodiments, the interfacial dielectric layer includes a thin interfacial layer (e.g., silicon oxide) and a high-k layer (e.g., $Al_2O_3$, $HfO_2$) formed through a low-temperature chemical process (e.g., at about 200° C. to about 300° C.). For example, a low-temperature high-pressure annealing (HPA) process is performed to reduce the interfacial defects. In certain embodiments, a high-temperature annealing (e.g., rapid thermal annealing) is carried out, e.g., at about 800° C. to about 900° C. for a short time period.

Figure 7B:
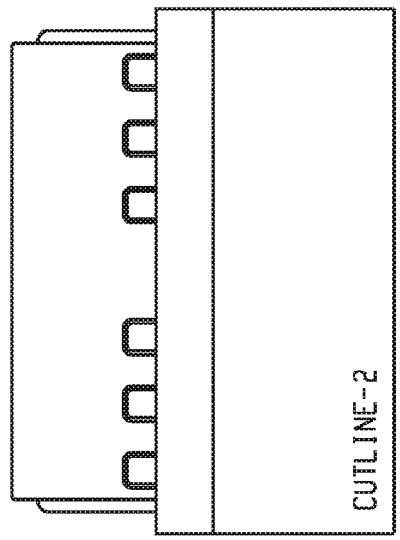
Figure 7C:
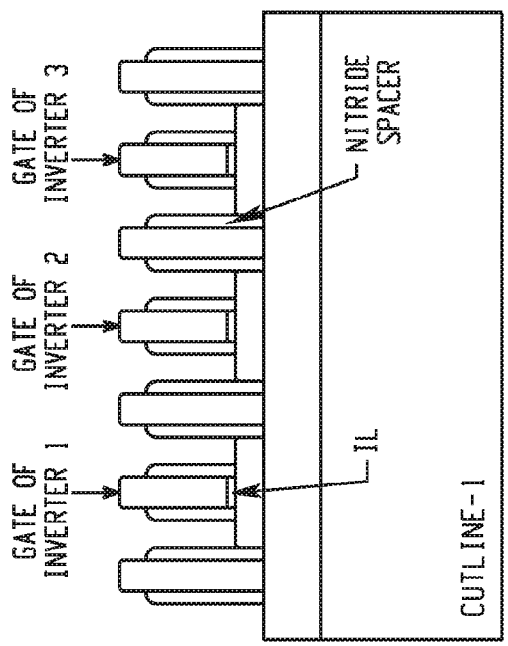
Figure 7A:
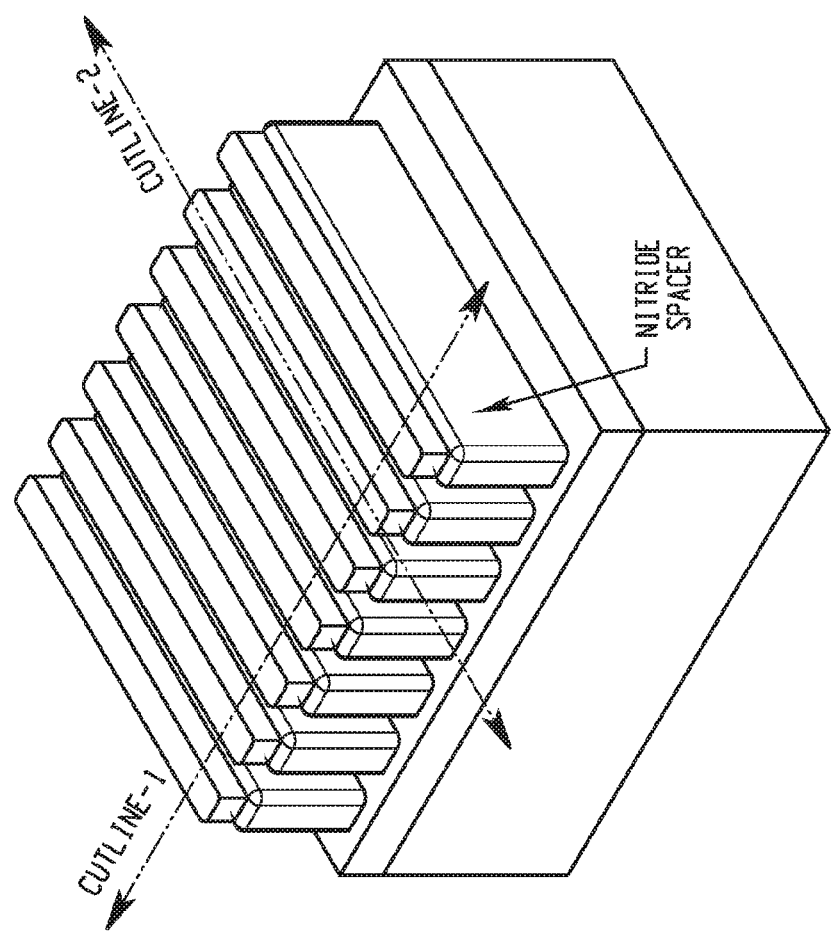
Figure 8B:
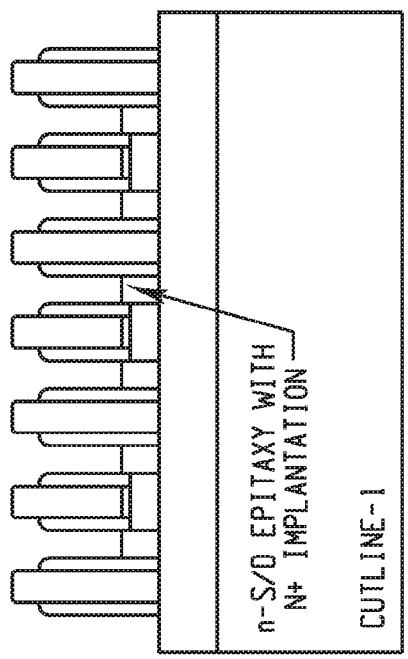
Figure 8C:
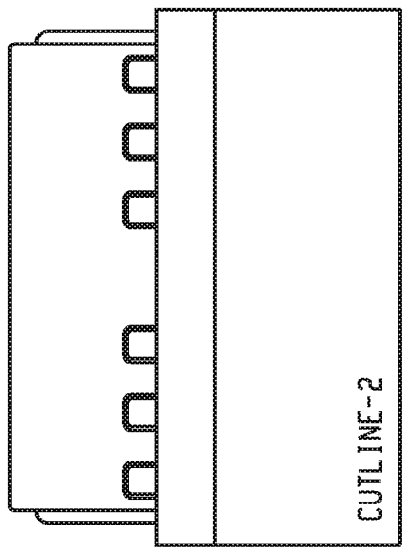
Figure 8A:
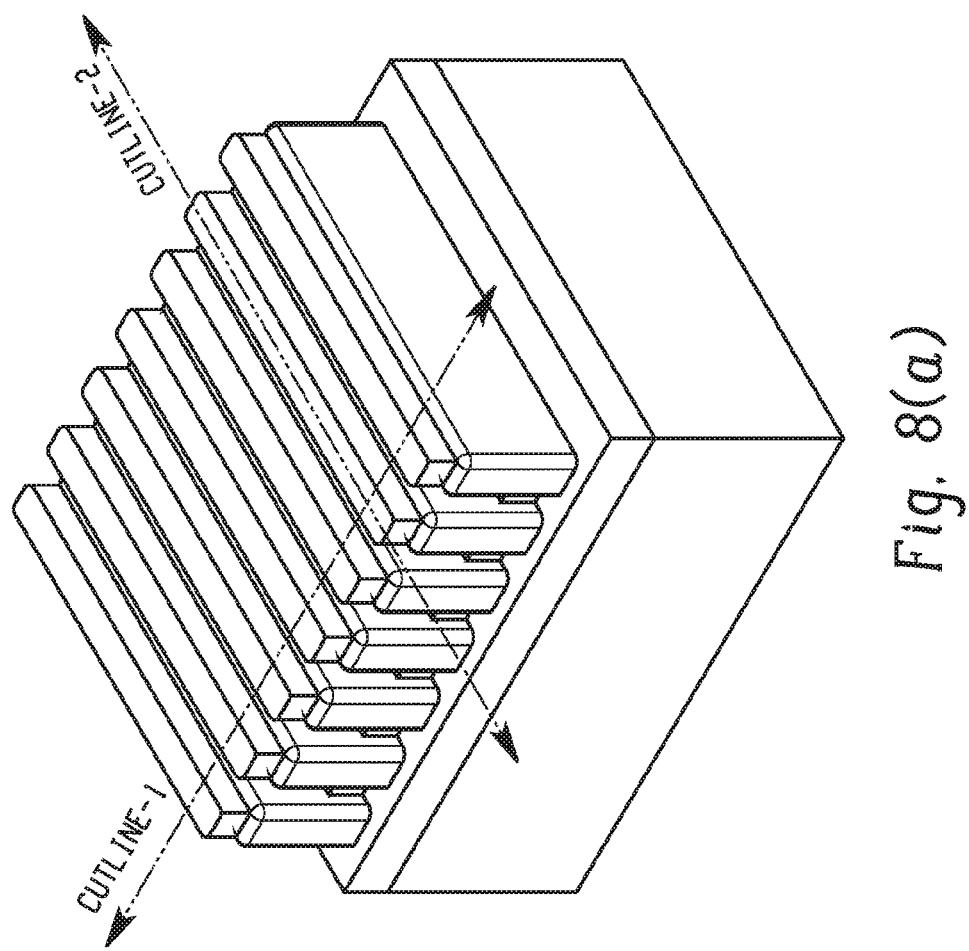

Spacers (e.g., silicon nitride, TEOS) are formed (e.g., at about 650° C. to about 700° C.) to generate a structure as shown in FIG. 7(a). Cross-sectional views along the cutlines "cutline-1" and "cutline-2" are shown in FIG. 7(b) and FIG. 7(c) respectively. For example, as shown in FIG. 7(b), gate structures for the inverters 208, 210 and 212 are formed. Source/drain regions are then grown epitaxially (e.g., at about 680° C. to about 750° C.), and a subsequent implantation (e.g., n+ doping) is performed, as shown in FIG. 8(a). Cross-sectional views along the cutlines "cutline-1" and "cutline-2" are shown in FIG. 8(b) and FIG. 8(c) respectively. In some embodiments, the implantation is replaced with in situ doping. For example, a high-temperature annealing is performed to reduce defects and activate dopants.

Figure 9B:
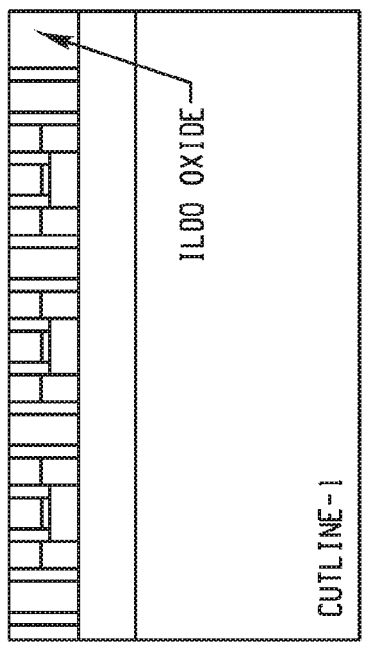
Figure 9C:
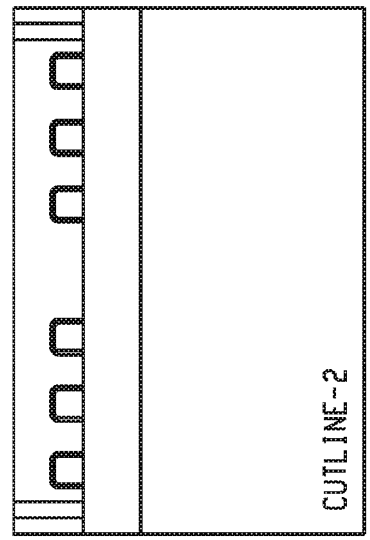
Figure 9A:
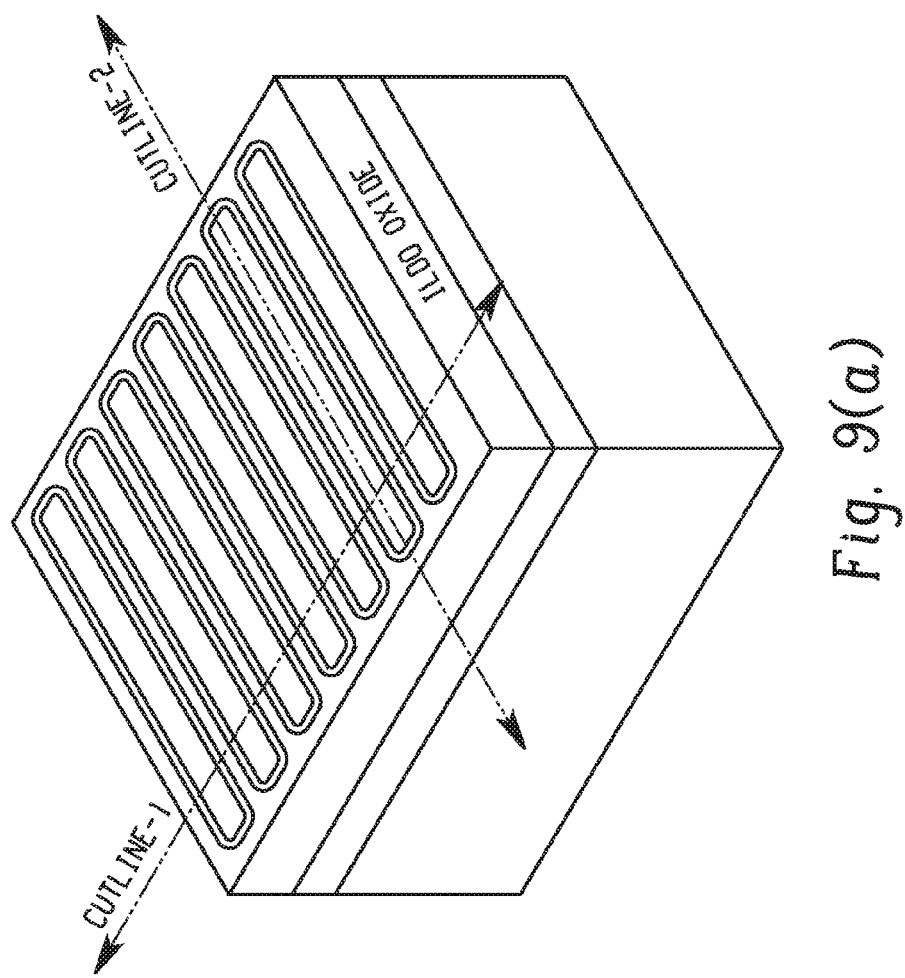

An inter-layer dielectric layer (ILD0) (e.g., oxides) is formed (e.g., through deposition) and planarized (e.g., through CMP), as shown in FIG. 9(a), and cross-sectional views along the cutlines "cutline-1" and "cutline-2" are shown in FIG. 9(b) and FIG. 9(c) respectively. Photolithography and an etching process are implemented to form patterns for deposition of one or more conductive layers, as shown in FIG. 10(a). A cross-sectional view of the structure shown in FIG. 10(a) along the cutline "cutline-1" is shown in FIG. 10(b).

Figure 11B:
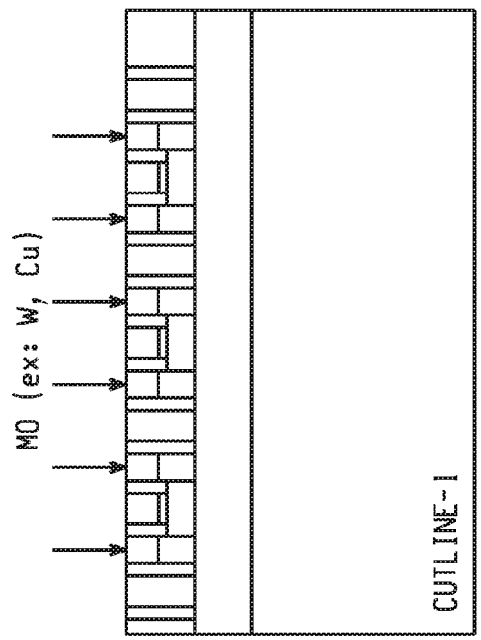
Figure 11C:
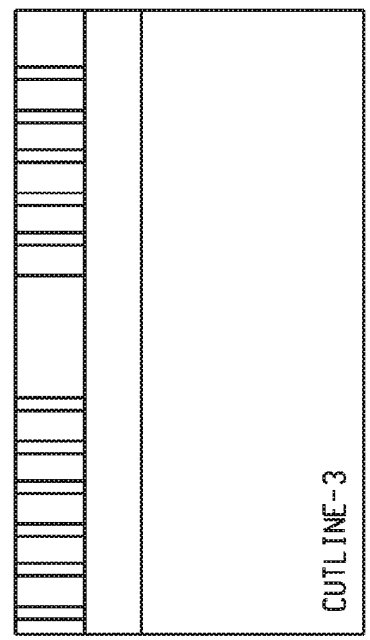
Figure 11A:
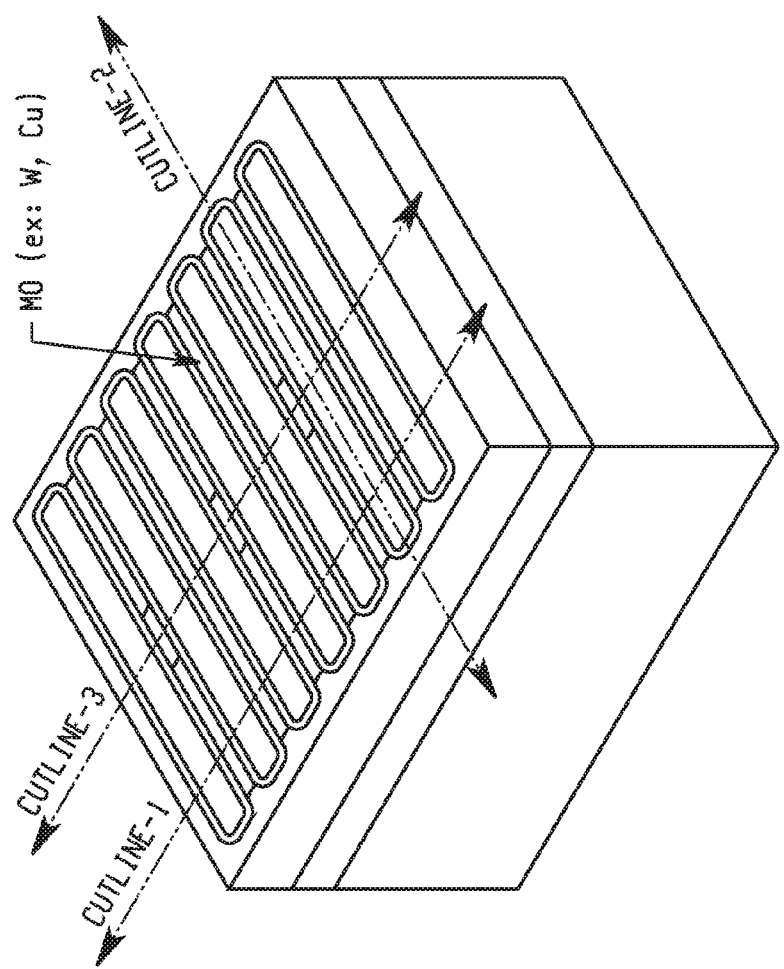

In some embodiments, a salicidation process is then performed (e.g., with an annealing process at about 600° C.). In other embodiments, the salicidation process is replaced by a process of forming a metal-insulator-semiconductor (MIS) contact structure. A conductive layer including one or more metal materials (e.g., tungsten, copper) is deposited and planarized, as shown in FIG. 11(a), and cross-sectional views along the cutlines "cutline-1" and "cutline-3" are shown in FIG. 11(b) and FIG. 11(c) respectively.

Figure 12B:
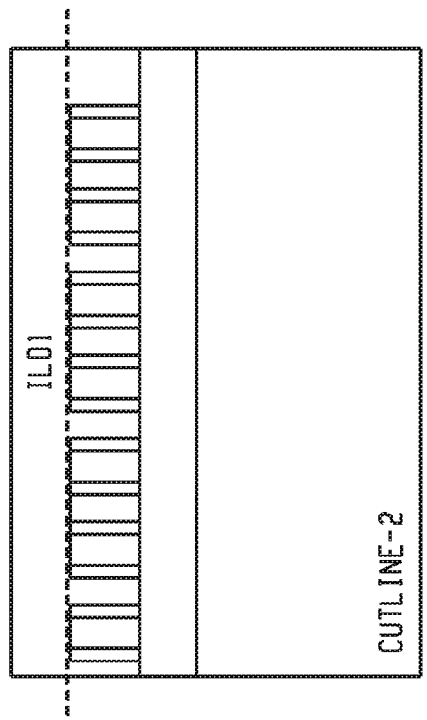
Figure 12A:
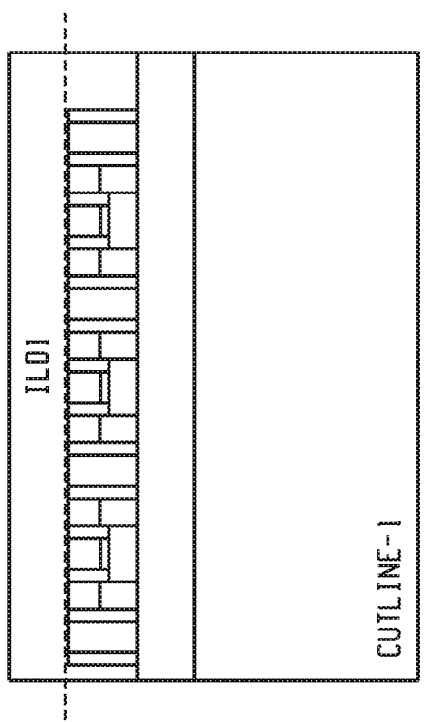
Figure 12C:
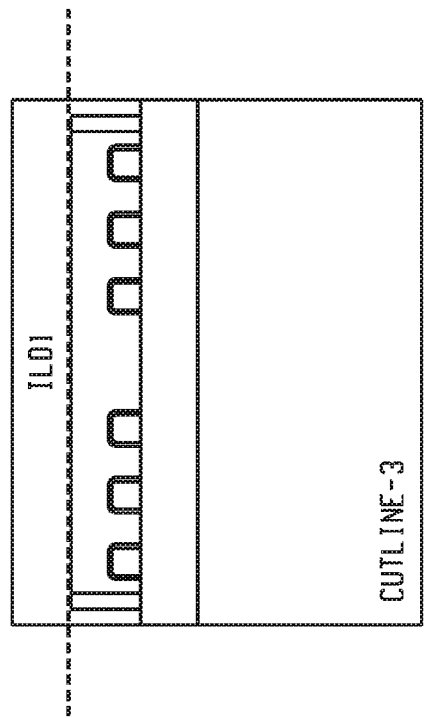

One or more back-end-of-line (BEOL) processes are performed on the wafer. For example, another inter-layer dielectric layer (ILD1) is formed (e.g., through deposition) and planarized (e.g., through CMP). Cross-sectional views of the wafer along the cutlines "cutline-1," "cutline-2" and "cutline-3" are shown in FIG. 12(a), FIG. 12(b) and FIG. 12(c) respectively. As an example, the inter-layer dielectric layer includes silicon oxides.

Figure 13A:
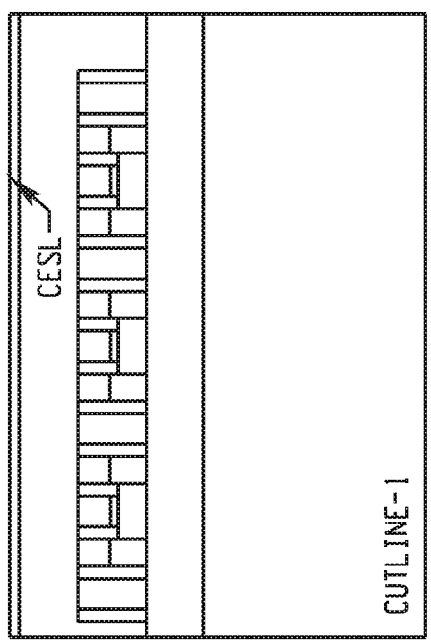
Figure 13B:
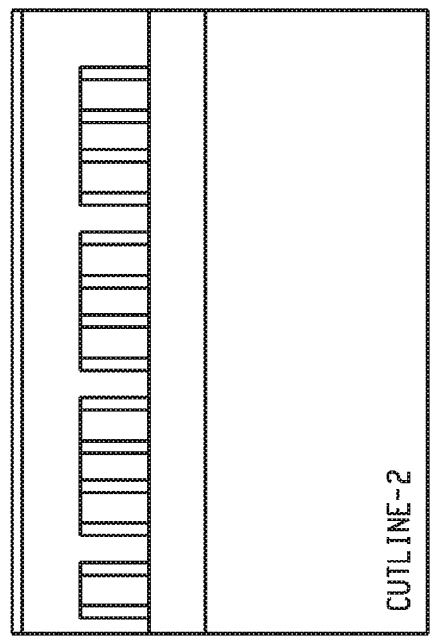
Figure 13C:
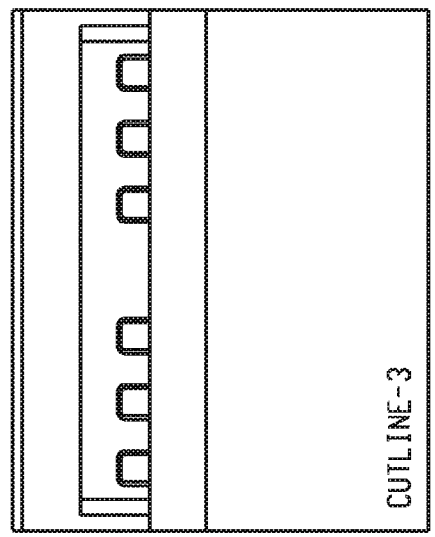

A hard mask layer (HM1) is then formed on the inter-layer dielectric layer (ILD1). Cross-sectional views of the wafer after the hard mask formation along the cutlines "cutline-1," "cutline-2" and "cutline-3" are shown in FIG. 13(a), FIG. 13(b) and FIG. 13(c) respectively. For example, the hard mask layer corresponds to a contact-etch-stop layer (CESL) and includes silicon nitrides. The CESL layer is then patterned through photolithography and etching (e.g., dry etching, wet etching). Cross-sectional views of the wafer after the CESL patterning along the cutlines "cutline-1," "cutline-2" and "cutline-3" are shown in FIG. 14(a), FIG. 14(b) and FIG. 14(c) respectively.

Figure 15C:
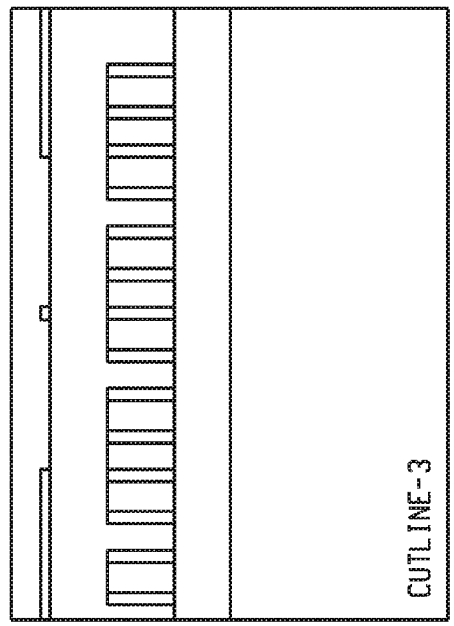
Figure 15A:
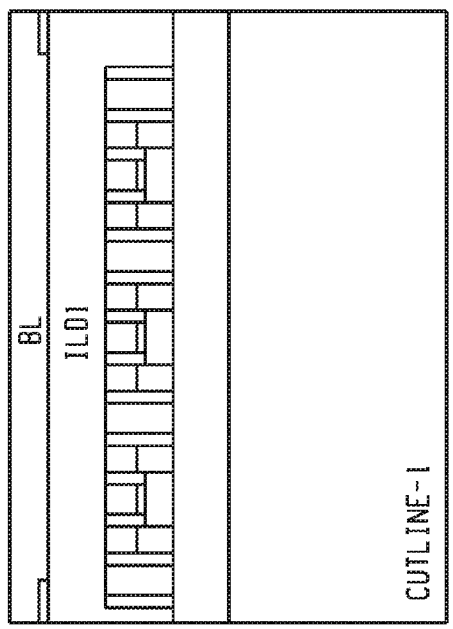
Figure 15B:
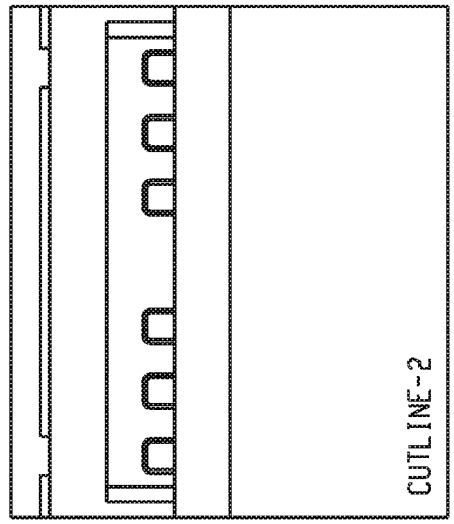
Figure 16A:
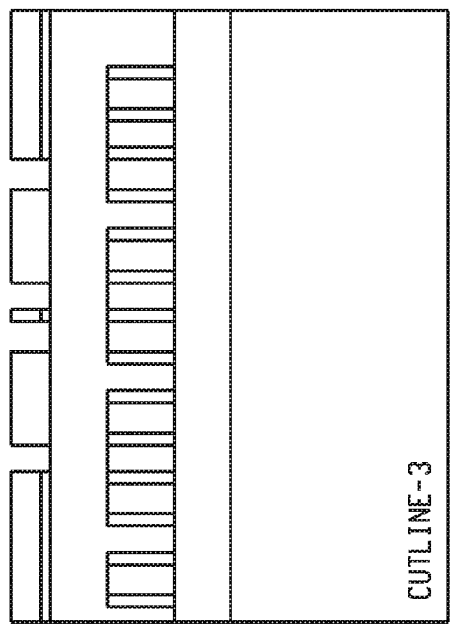
Figure 16B:
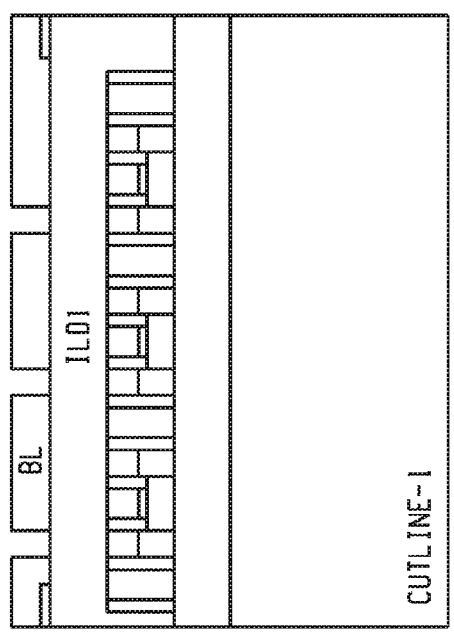
Figure 16C:
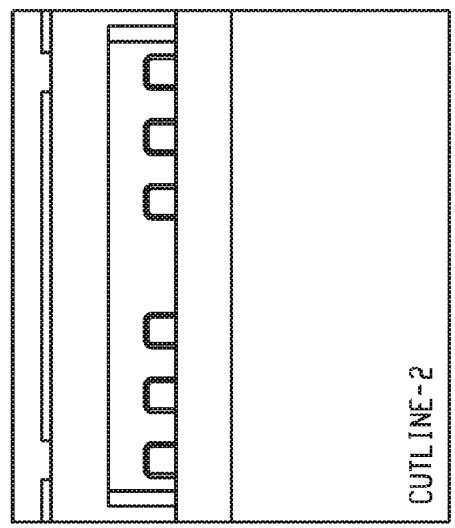

Another hard mask layer, e.g., a bottom layer (BL), is formed (e.g., through deposition). Cross-sectional views of the wafer after the formation of the bottom layer along the cutlines "cutline-1," "cutline-2" and "cutline-3" are shown in FIG. 15(a), FIG. 15(b) and FIG. 15(c) respectively. The bottom layer is then patterned through photolithography and etching (e.g., dry etching, wet etching). Cross-sectional views of the wafer after the patterning of the bottom layer along the cutlines "cutline-1," "cutline-2" and "cutline-3" are shown in FIG. 16(a), FIG. 16(b) and FIG. 16(c) respectively.

Figure 17A:
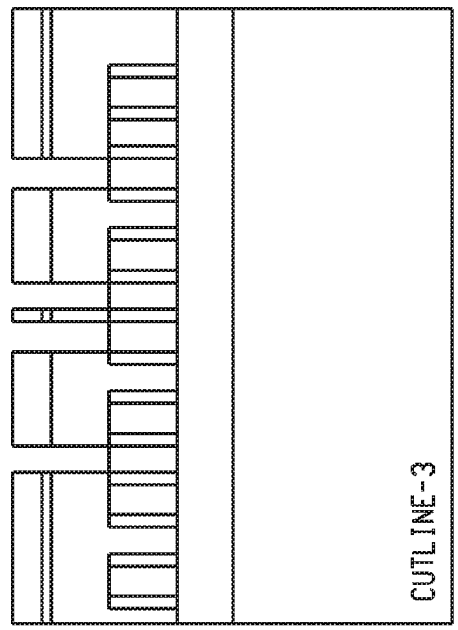
Figure 17B:
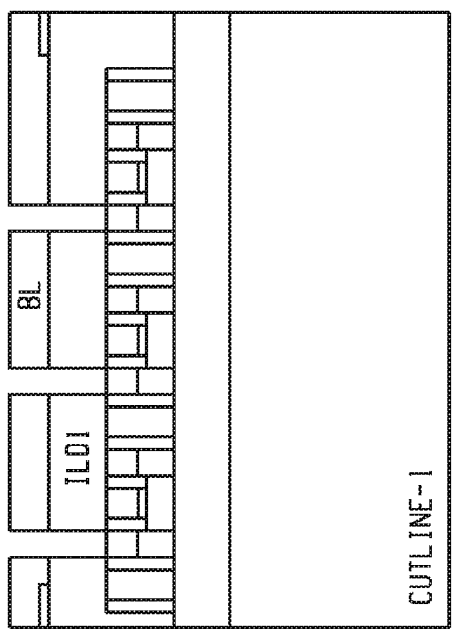
Figure 17C:
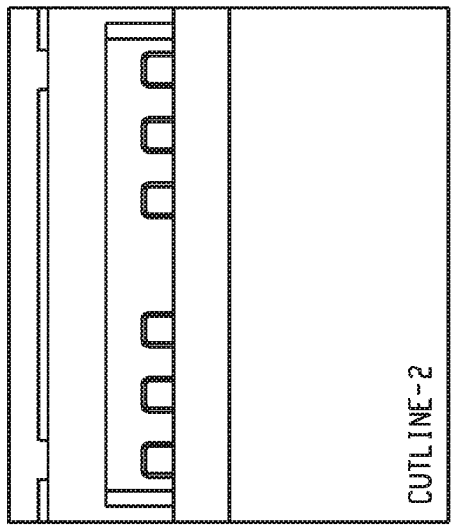

Subsequently, the inter-layer dielectric layer (ILD1) is etched (e.g., through dry etching or wet etching) using the bottom layer as the hard mask. Cross-sectional views of the wafer after the etching of the inter-layer dielectric layer (ILD1) along the cutlines "cutline-1," "cutline-2" and "cutline-3" are shown in FIG. 17(a), FIG. 17(b) and FIG. 17(c) respectively. Then, the bottom layer is removed, and cross-sectional views of the wafer after the removal of the bottom layer along the cutlines "cutline-1," "cutline-2" and "cutline-3" are shown in FIG. 18(a), FIG. 18(b) and FIG. 18(c) respectively.

Furthermore, the inter-layer dielectric layer (ILD1) is etched (e.g., through dry etching or wet etching) using the CESL layer as the hard mask, and cross-sectional views of the wafer along the cutlines "cutline-1," "cutline-2" and "cutline-3" are shown in FIG. 19(a), FIG. 19(b) and FIG. 19(c) respectively. For example, a certain thickness (e.g., d) of the inter-layer dielectric layer (ILD1) remains after etching. In some embodiments, the CESL layer is removed thereafter. Cross-sectional views of the wafer after the removal of the CESL layer along the cutlines "cutline-1," "cutline-2" and "cutline-3" are shown in FIG. 20(a), FIG. 20(b) and FIG. 20(c) respectively.

Figure 21B:
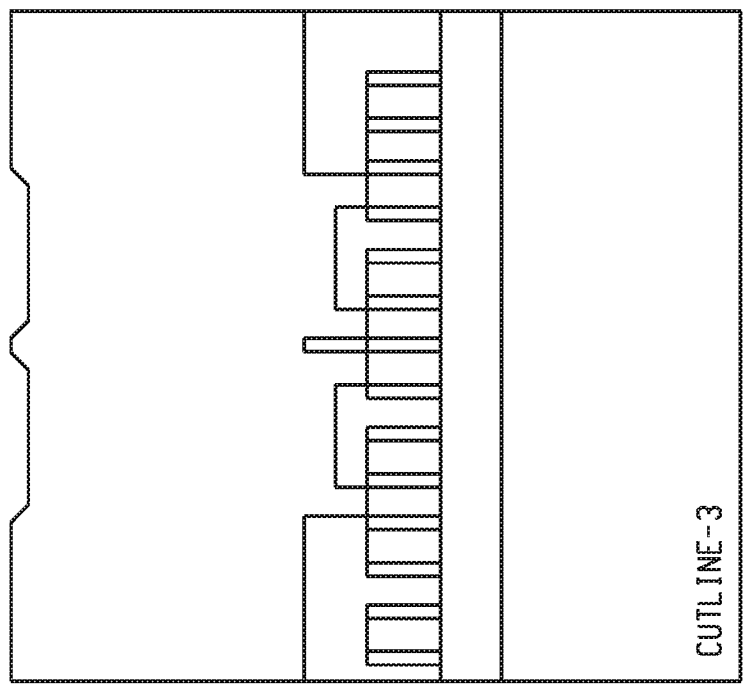
Figure 21A:
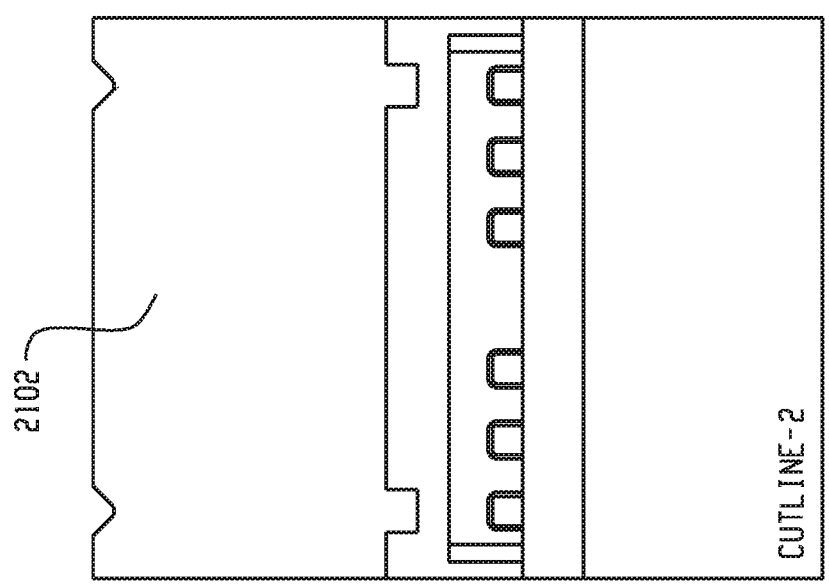
Figure 22A:
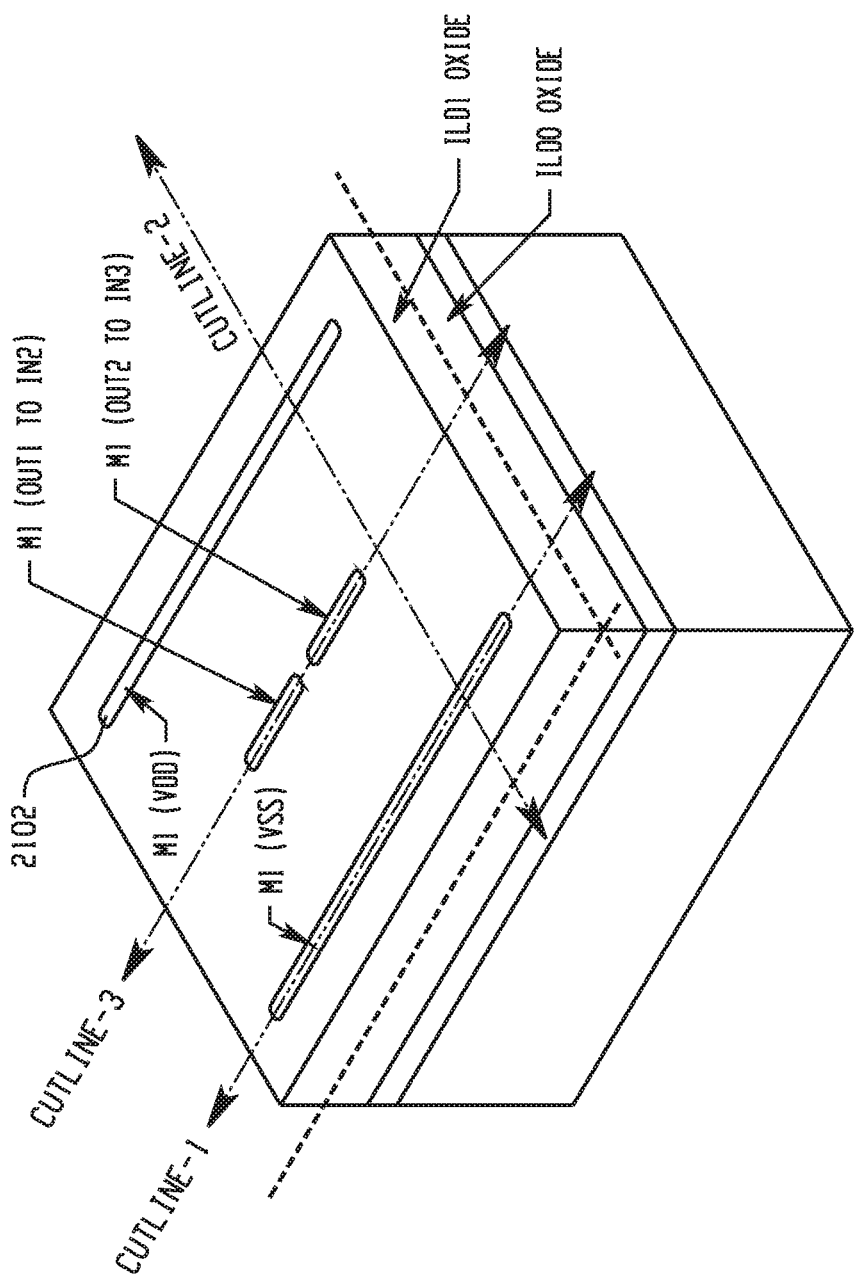
Figure 22B:
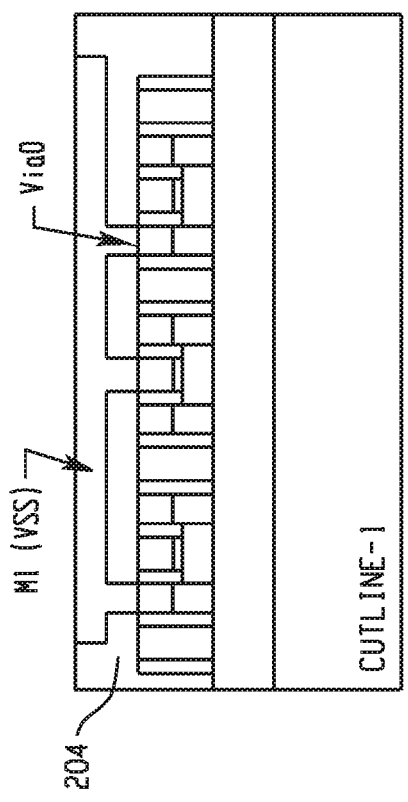
Figure 22C:
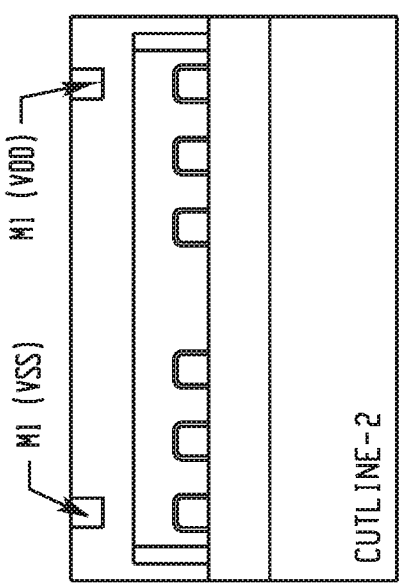
Figure 22D:
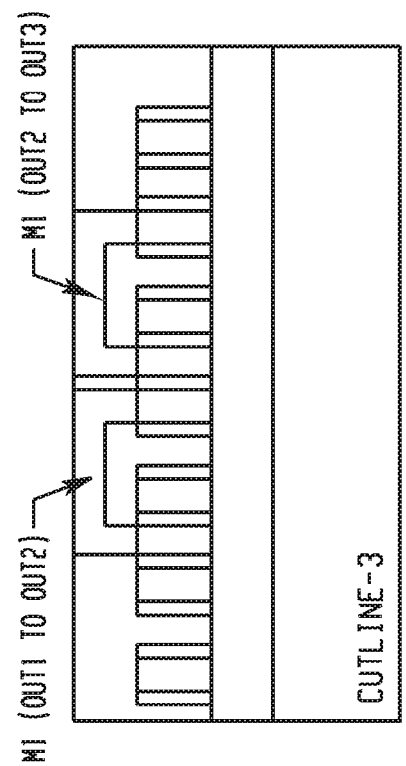

A conductive layer 2102 is formed on the wafer, and cross-sectional views of the wafer along the cutlines "cutline-2" and "cutline-3" are shown in FIG. 21(a) and FIG. 21(b) respectively. For example, the conductive layer 2102 includes one or more metal materials (e.g., copper). The conductive layer 2102 is then planarized (e.g., through CMP), as shown in FIG. 22(a). Cross-sectional views of the wafer along the cutlines "cutline-1," "cutline-2" and "cutline-3" are shown in FIG. 22(b), FIG. 22(c) and FIG. 22(d) respectively. Thus, the first device layer 204 of the multi-layer semiconductor structure 200 is formed on the SOI wafer.

Figure 23:
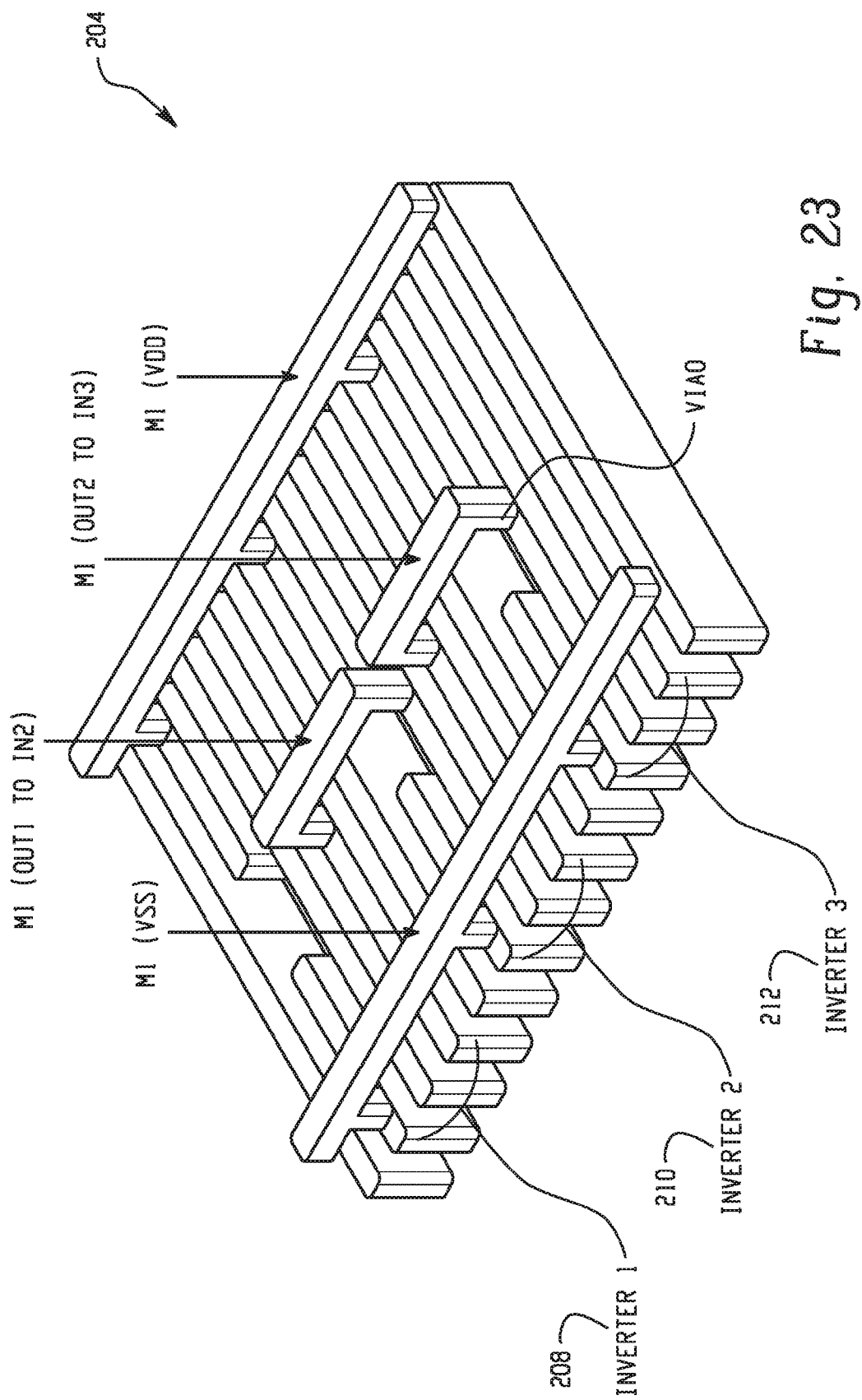
FIG. 23 depicts an example diagram showing certain components of a first device layer of a multi-layer semiconductor structure.

FIG. 23 depicts an example diagram showing certain components of the first device layer 204 of the multi-layer semiconductor structure 200. As shown in FIG. 23, the inverters 208 and 210 and 212 are formed in the device layer 204. The substrate, the buried oxide, the inter-layer dielectric layers, and the spacers are not shown in FIG. 23.

Figure 24A:
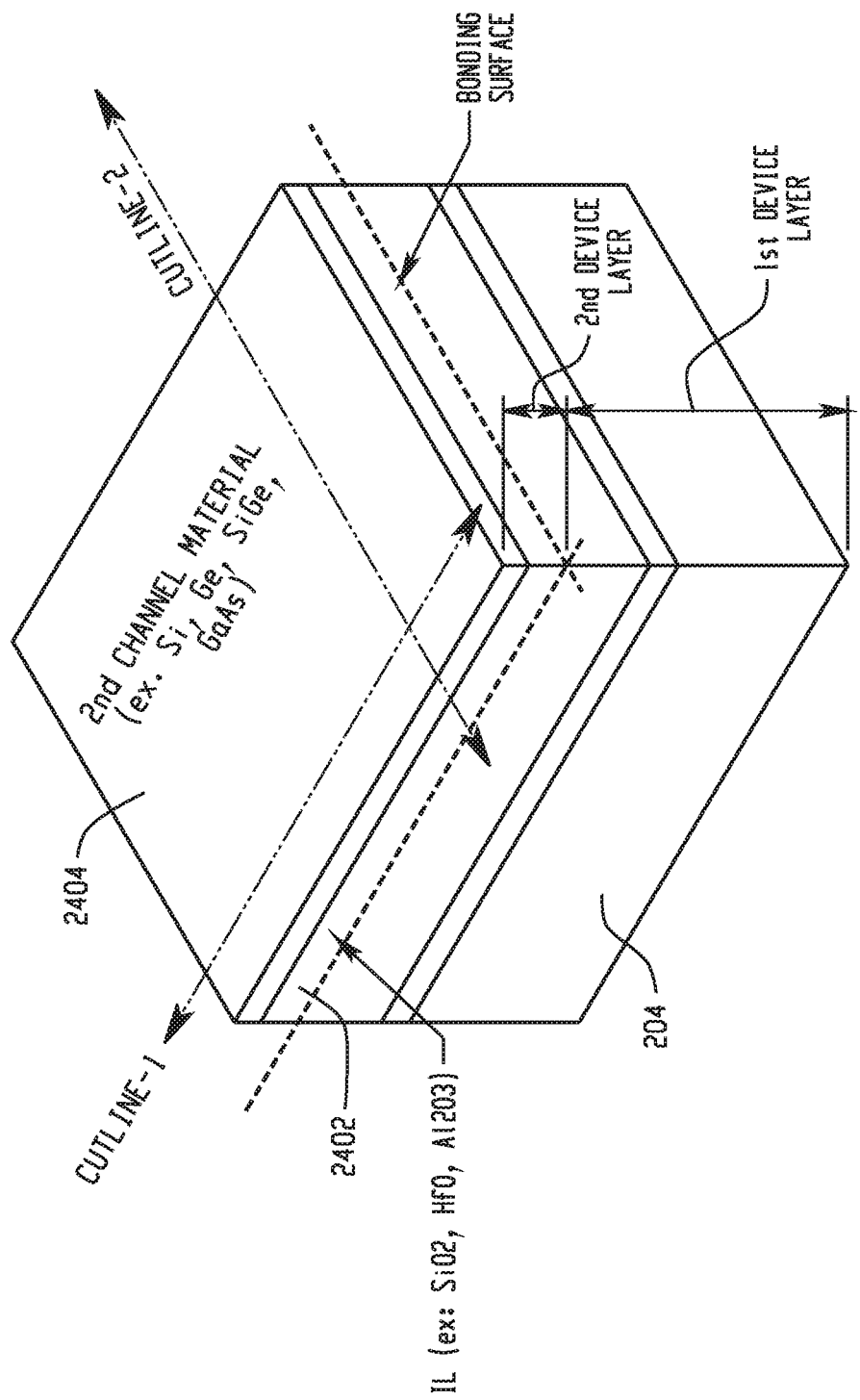

FIG. 24(a)-FIG. 44(c) depict diagrams showing an example process for fabricating the second device layer 206 of the multi-layer semiconductor structure 200. As shown in FIG. 24(a), an interfacial layer 2402 (e.g., a glue/buffer layer, a buried oxide layer) and a channel material layer 2404 are formed on the first device layer 204. In some embodiments, another wafer including the interfacial layer 2402 and the channel material layer 2404 is attached to the first device layer 204 through wafer bonding. In certain embodiments, the interfacial layer 2402 and the channel material layer 2404 are formed on the first device layer 204 through deposition or epitaxial growth. As an example, the interfacial layer 2402 includes silicon oxide, hafnium oxide, aluminum oxide, or other suitable materials. The channel material layer 2404 includes silicon, germanium, silicon germanium, gallium arsenide, or other suitable materials. Cross-sectional views along the cutlines "cutline-1" and "cutline-2" are shown in FIG. 24(b) and FIG. 24(c) respectively.

Figure 26:
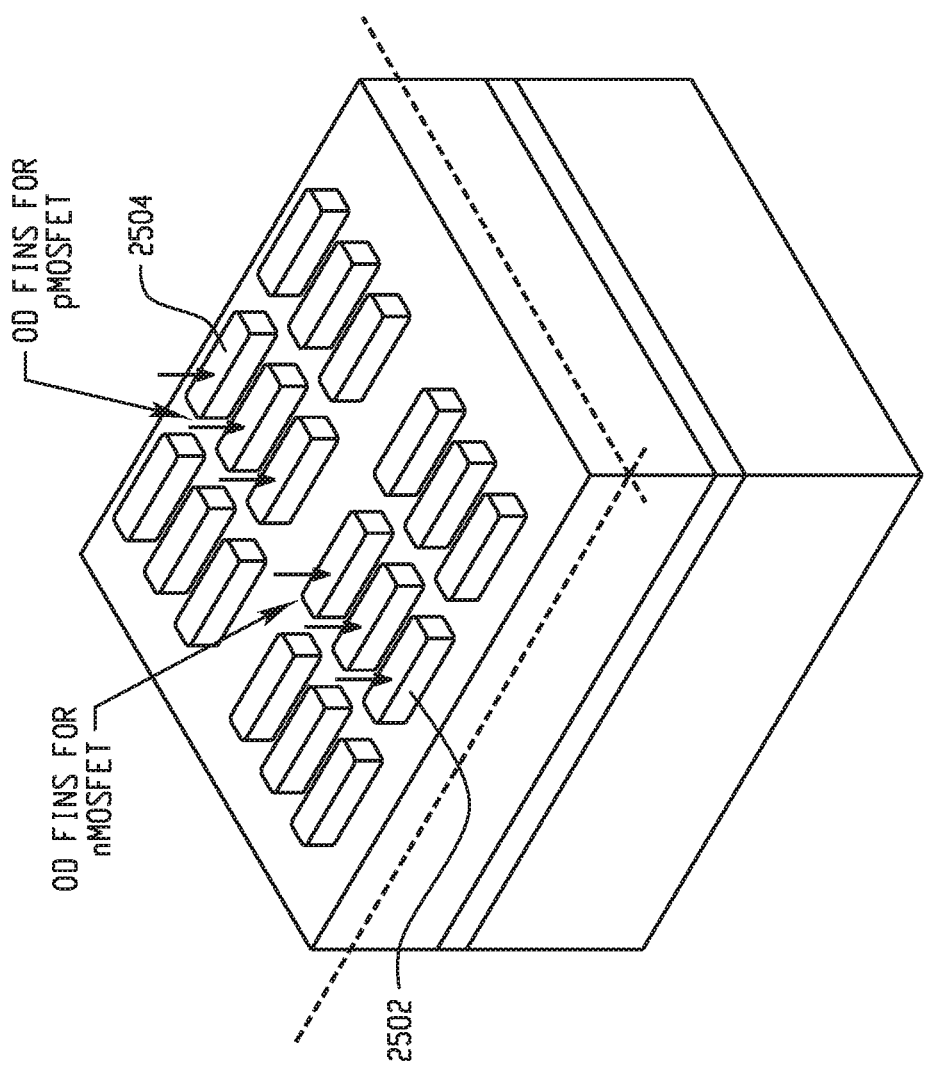
Figure 26B:
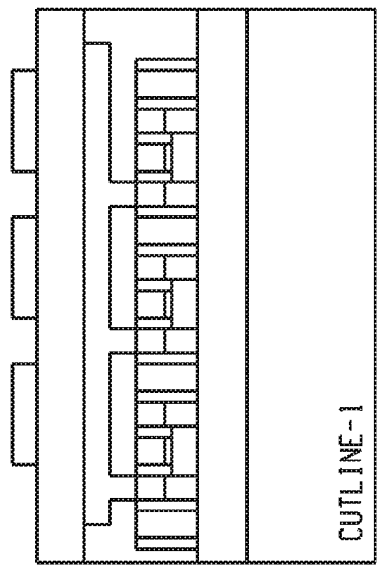
Figure 26C:
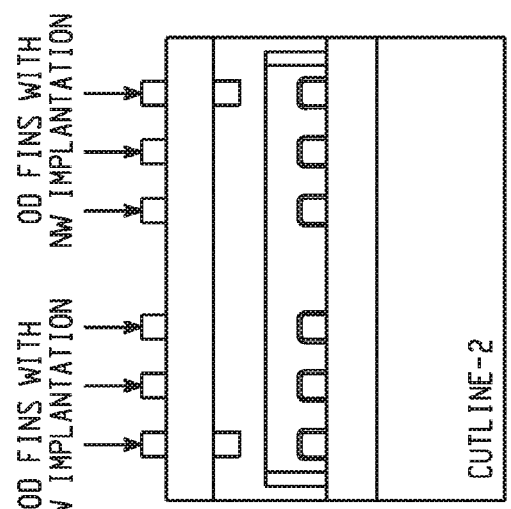
Figure 26A:
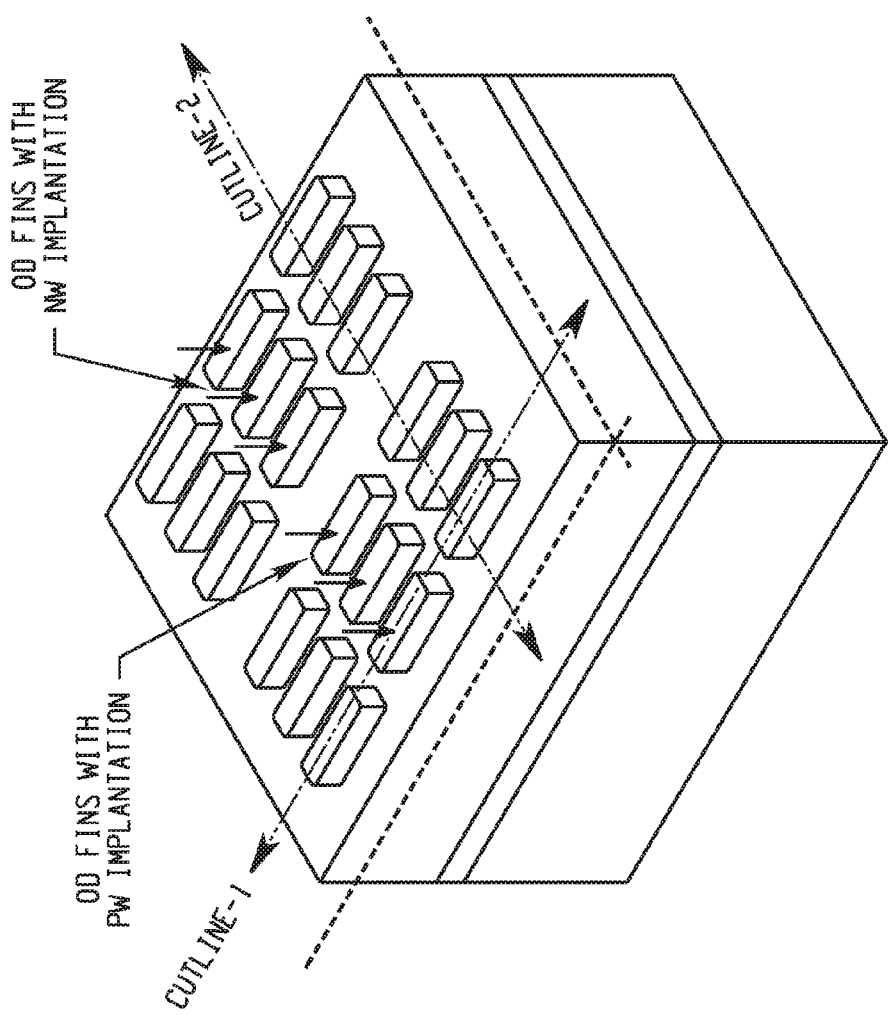

A number of fin structures are formed in the channel material layer 2404 through photolithography and etching (e.g., dry etching or wet etching). For example, one or more fin structures 2502 are formed to be active regions of n-type transistors (e.g., n-channel MOSFETs), and one or more fin structures 2504 are formed to be active regions of p-type transistors (e.g., p-channel MOSFETs), as shown in FIG. 25. Then, well implantation is performed on the fin structures 2502 and 2504, as shown FIG. 26(a), and cross-sectional views along the cutlines "cutline-1" and "cutline-2" are shown in FIG. 26(b) and FIG. 26(c) respectively. As an example, a high-temperature annealing (e.g., at about 1000° C. for 10 seconds) follows to reduce defects and activate dopants.

Figure 27A:
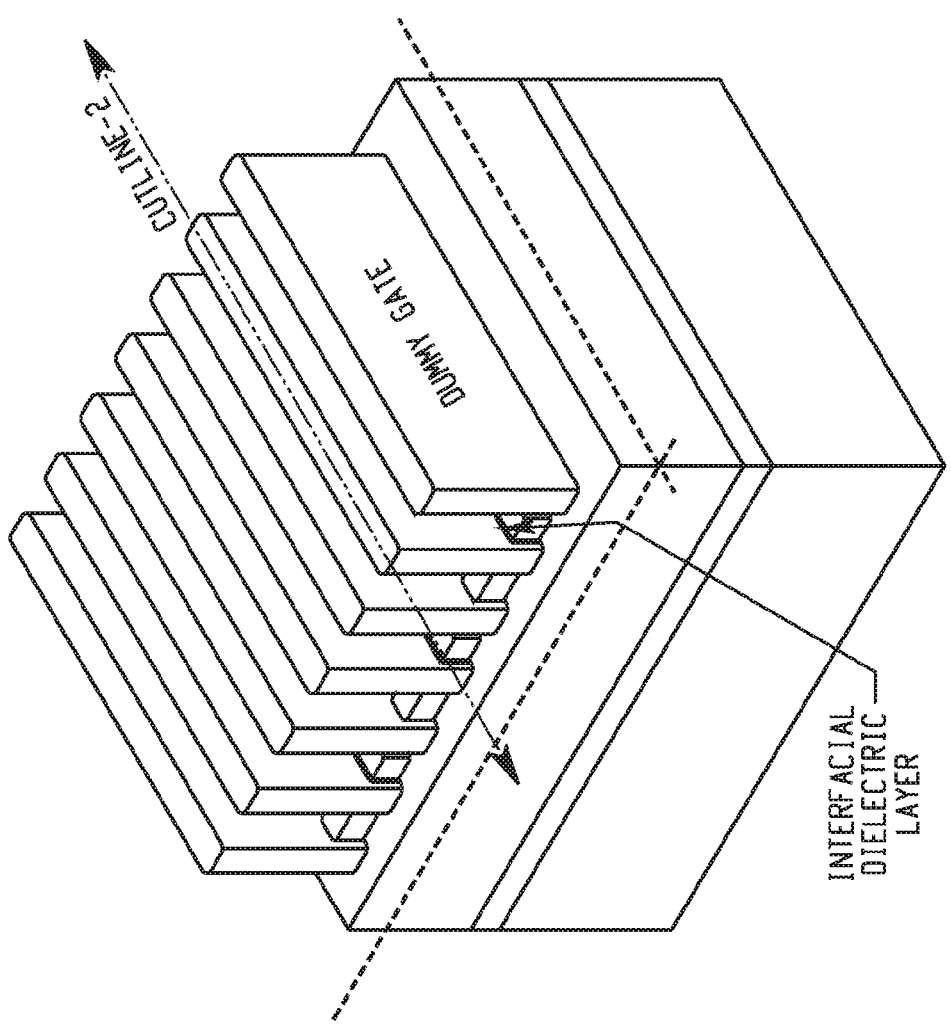
Figure 27B:
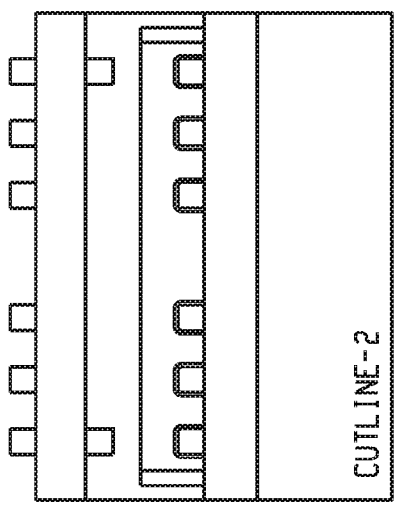

An interfacial dielectric layer is formed on the fin structures, and a gate-structure layer (e.g., a dummy-gate layer) is deposited and planarized (e.g., through CMP) thereafter. The gate-structure layer is then patterned through photolithography and etching (e.g., dry etching, wet etching), and the interfacial dielectric layer is etched, as shown in FIG. 27(a). A cross-sectional view along the cutline "cutline-2" is shown in FIG. 27(b). For example, the interfacial dielectric layer includes silicon oxide, hafnium oxide, aluminum oxide, or other suitable materials. The gate-structure layer includes polysilicon, aluminum, copper, tungsten, or other suitable materials.

Figure 29B:
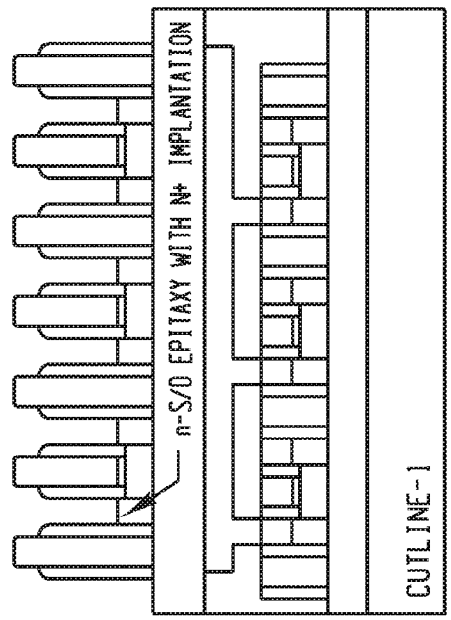
Figure 29C:
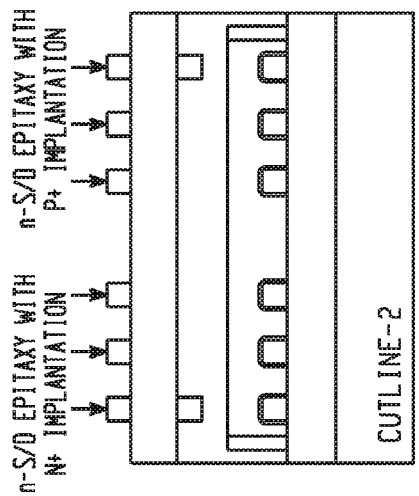
Figure 29A:
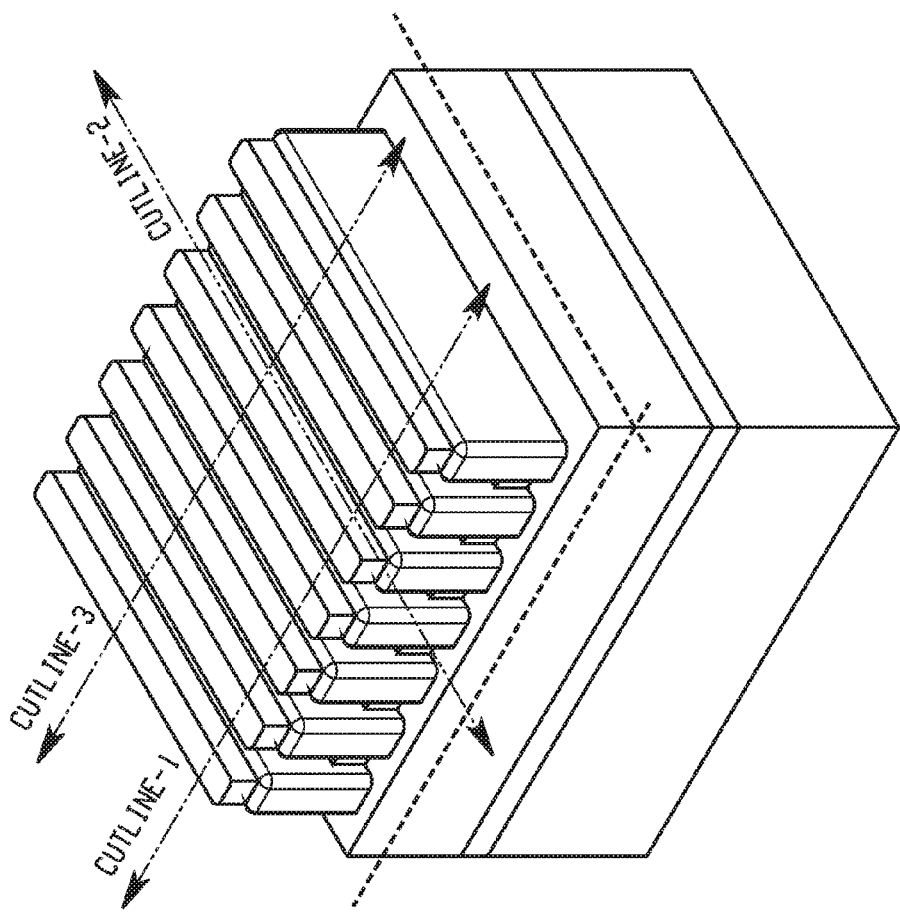

Spacers (e.g., silicon nitride, TEOS) are formed (e.g., at about 650° C. to about 700° C.) to generate a structure as shown in FIG. 28(a). A cross-sectional view along the cutline "cutline-1" is shown in FIG. 28(b). For example, as shown in FIG. 28(b), gate structures for the inverters 214, 216 and 218 are formed. Source/drain regions are then grown epitaxially (e.g., at about 680° C. to about 750° C.), and a subsequent implantation (e.g., n+doping) is performed, as shown in FIG. 29(a). Cross-sectional views along the cutlines "cutline-1" and "cutline-2" are shown in FIG. 29(b) and FIG. 29(c) respectively. In some embodiments, the implantation is replaced with in situ doping. For example, a high-temperature annealing is performed to reduce defects and activate dopants.

Figure 30B:
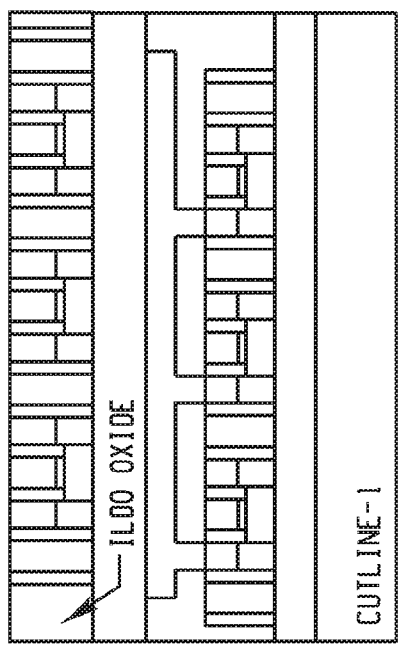
Figure 30C:
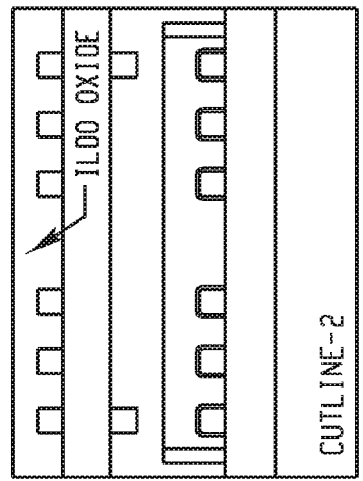
Figure 30A:
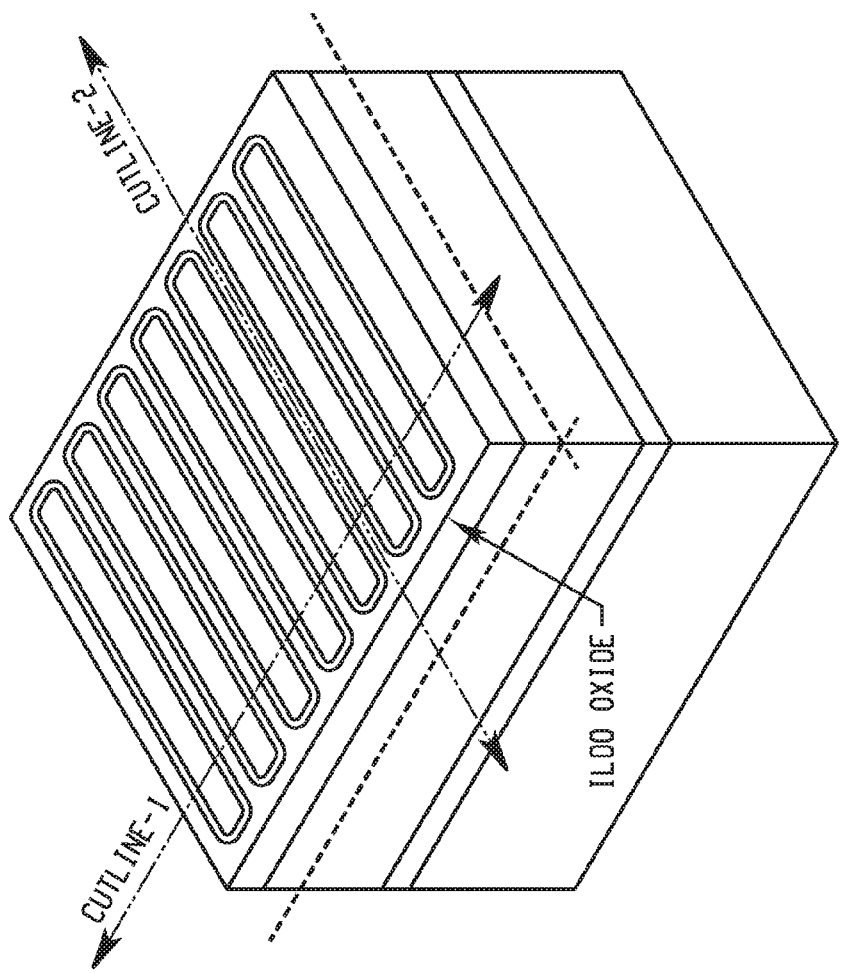
Figure 31B:
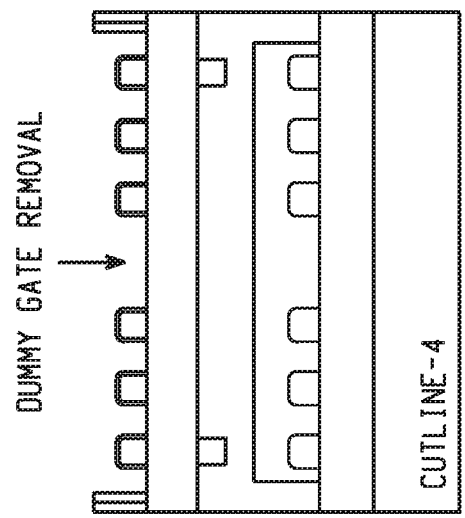
Figure 31A:
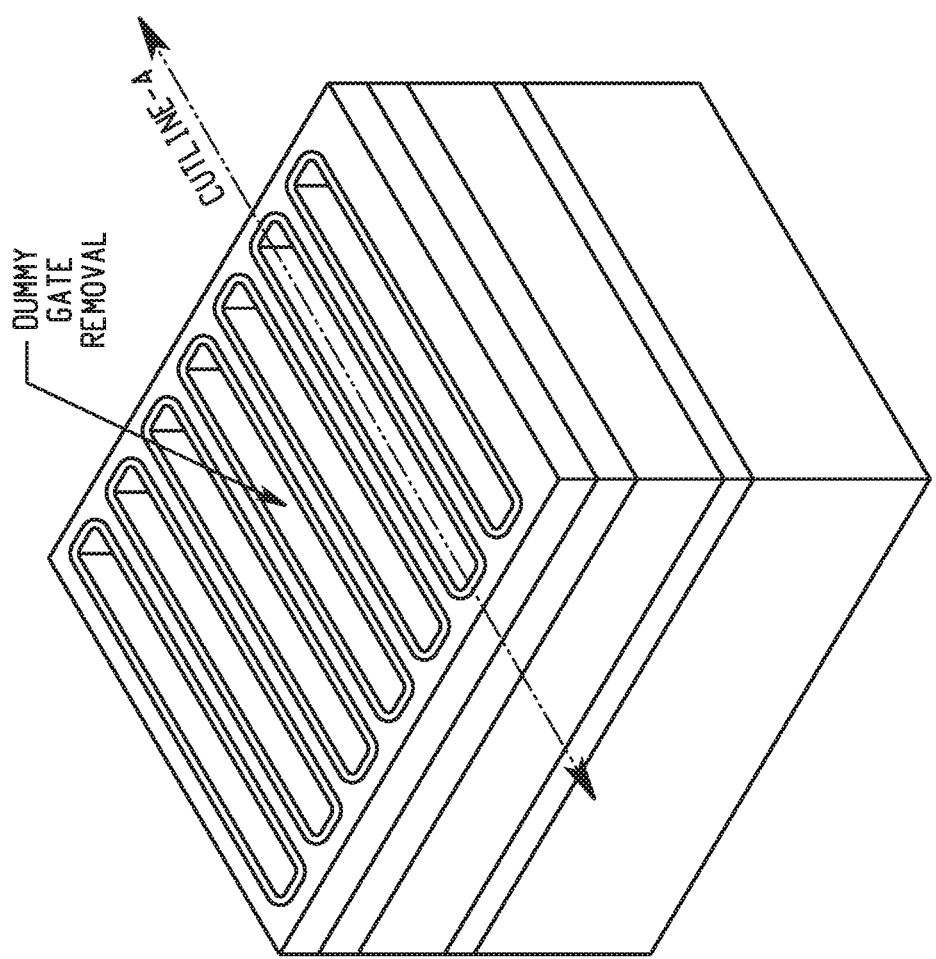

An inter-layer dielectric layer (ILD0) (e.g., oxides) is formed (e.g., through deposition) and planarized (e.g., through CMP), as shown in FIG. 30(a), and cross-sectional views along the cutlines "cutline-1" and "cutline-2" are shown in FIG. 30(b) and FIG. 30(c) respectively. At least part of the gate-structure layer (e.g., the dummy-gate layer) is removed, as shown in FIG. 31(a). A cross-sectional view along a cutline "cutline-4" is shown in FIG. 31(b).

An interfacial layer (e.g., silicon oxide) and a high-k layer (e.g., $Al_2O_3$, $HfO_2$) are formed, for example, through a low-temperature chemical process (e.g., at about 200° C. to about 300° C.). In some embodiments, a low-temperature high-pressure annealing (HPA) process is performed to reduce the interfacial defects. In certain embodiments, a high-temperature annealing (e.g., rapid thermal annealing) is carried out, e.g., at about 800° C. to about 900° C. for a short time period.

Figure 32B:
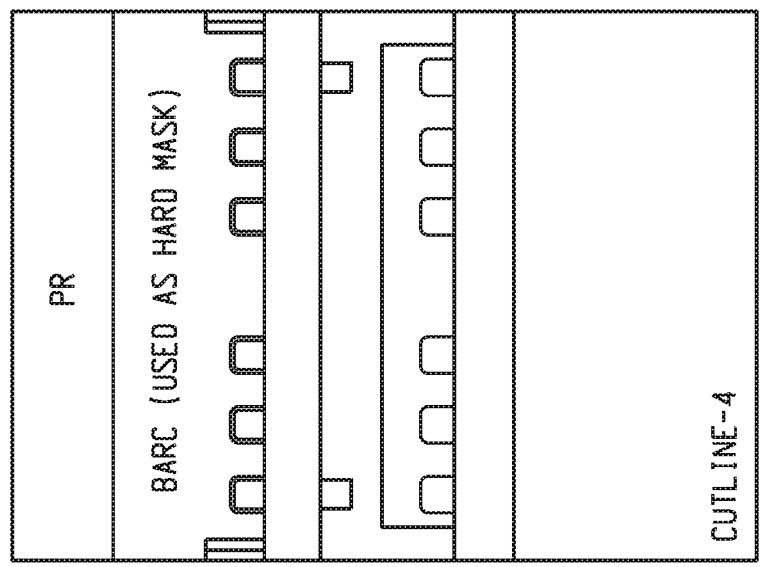
Figure 32A:
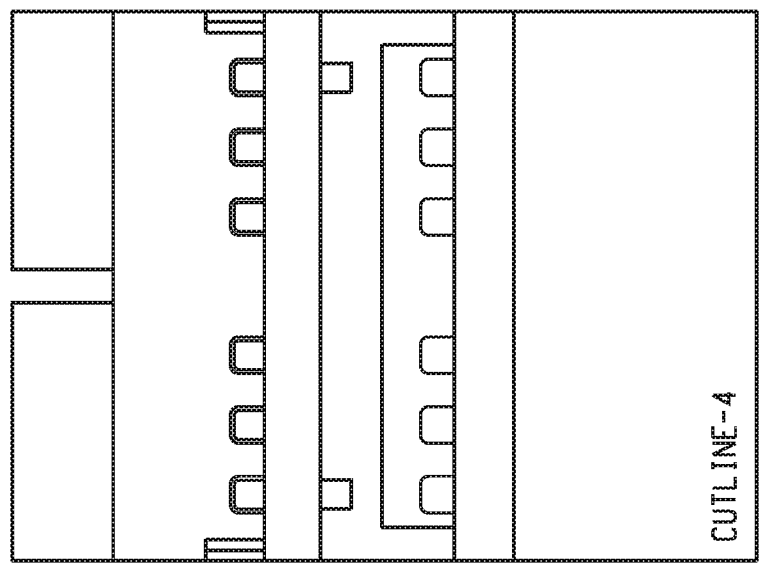

A bottom anti-reflective coating (BARC) layer is formed on the wafer as a hard mask, and a photo-resist layer is formed on the BARC layer, as shown in FIG. 32(a). Then, the photo-resist layer is exposed to light and patterned. Part of the photo-resist layer is removed, as shown in FIG. 32(b). The BARC layer is then etched (e.g., through wet etching or dry etching), as shown in FIG. 33(a). Thereafter, the photo-resist layer is removed, as shown in FIG. 33(b).

Figure 35:
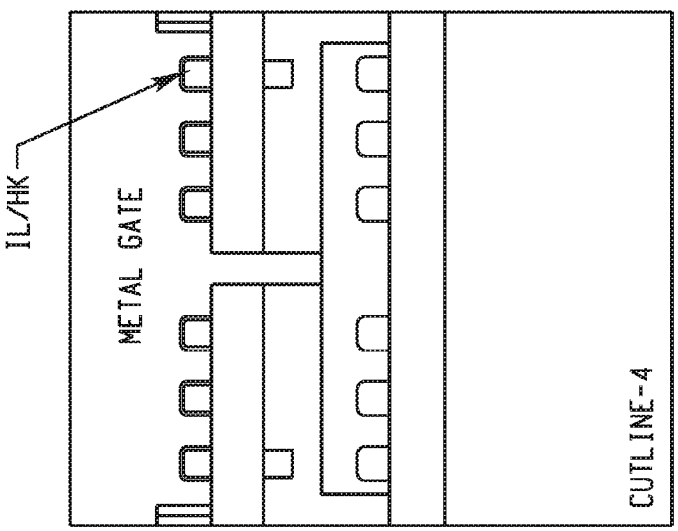
Figure 34B:
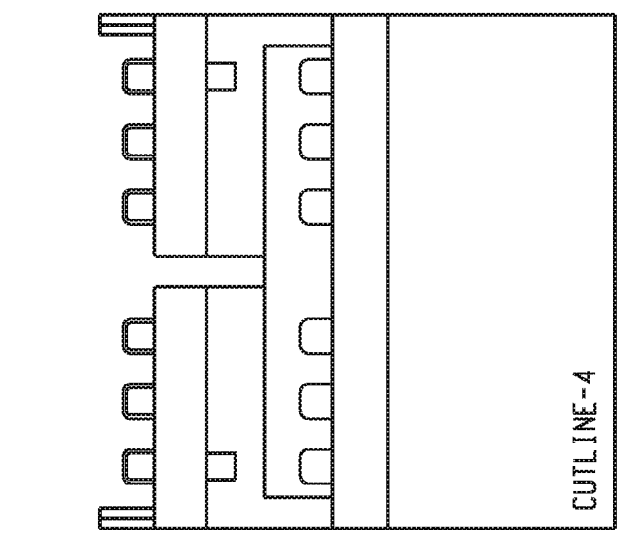
Figure 34A:
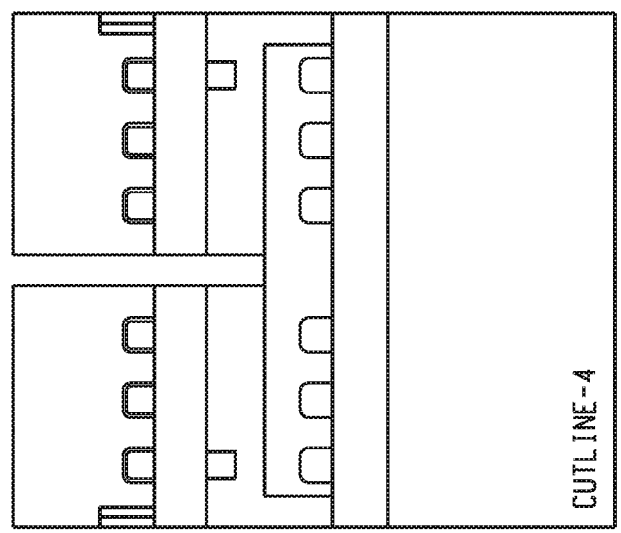
Figure 36B:
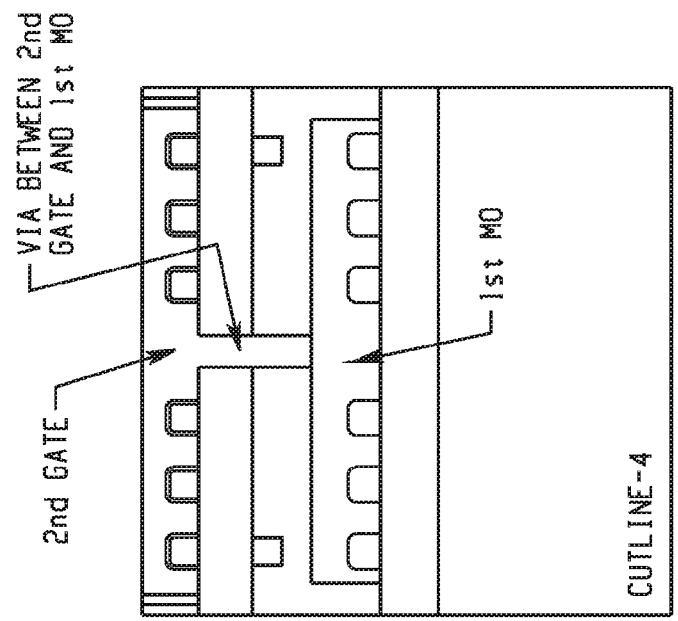
Figure 36A:
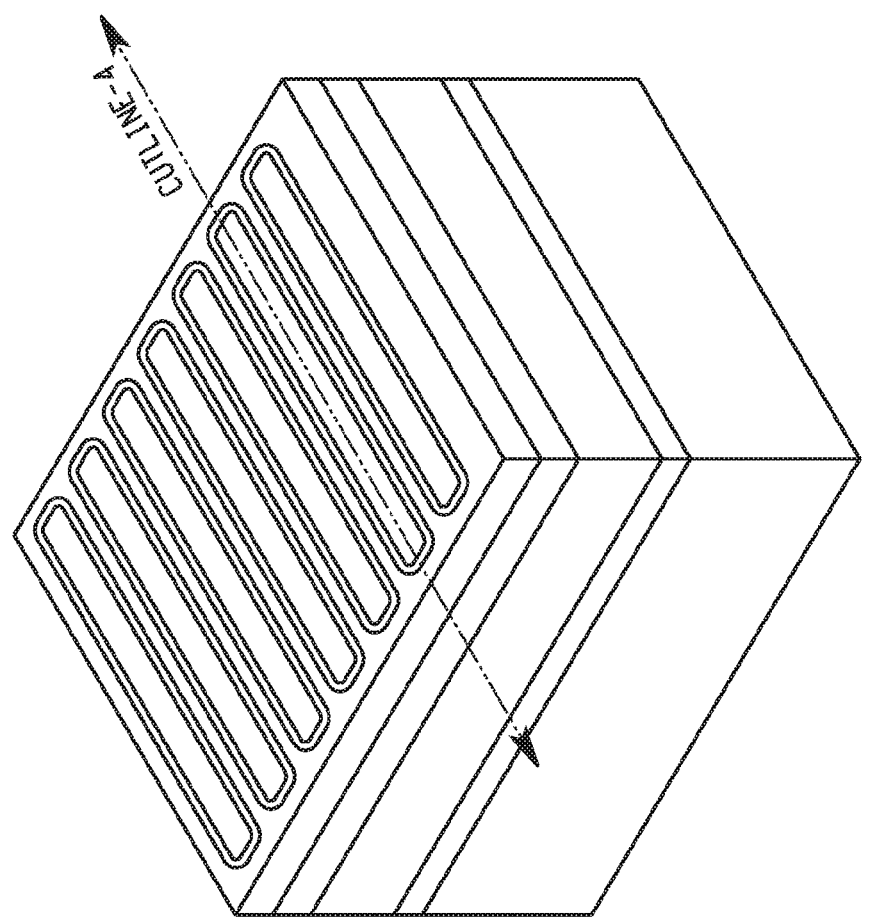

Further etching is performed, e.g., through the interfacial layer (e.g., the glue/buffer layer, or the buried oxide layer) and the inter-layer dielectric layer (ILDO), as shown in FIG. 34(a). The BARC layer is then removed, as shown in FIG. 34(b). A gate-stack layer (e.g., including one or more metal-based materials) is formed, as shown in FIG. 35. For example, the gate-stack layer includes TaN, TiN, Al, CuAl, or other suitable materials. The gate-stack layer is planarized, for example, through CMP, as shown in FIG. 36(a). One or more inter-layer connection structures (e.g., vias) are formed, for example, between the gate structures in the second device layer 206 and the source/drain contacts in the first device layer 204, as shown in FIG. 36(b).

Figure 38B:
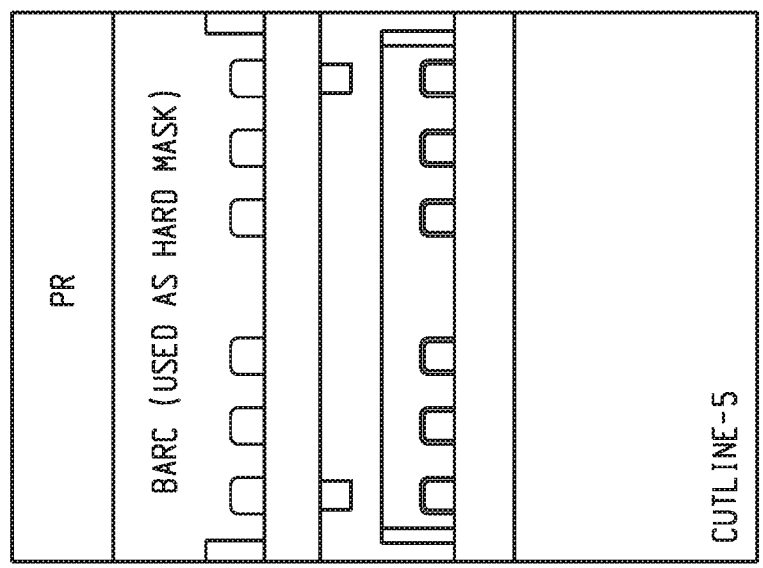
Figure 38A:
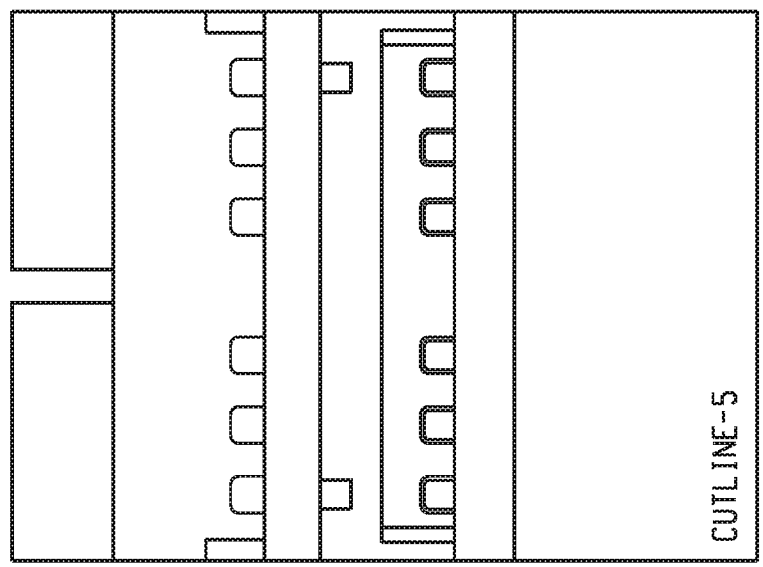
Figure 39B:
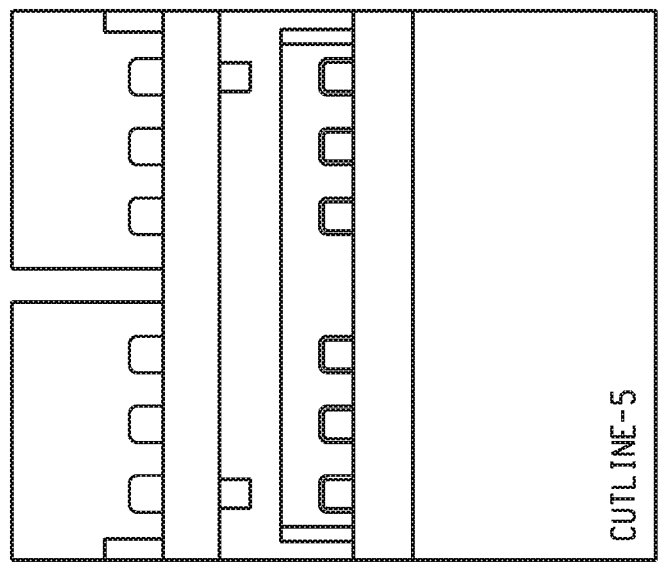
Figure 39A:
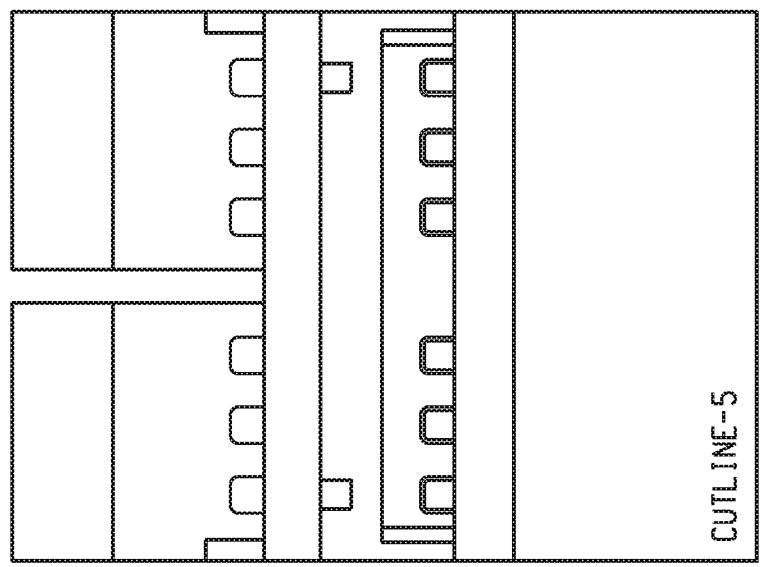

A conductive layer (e.g., tungsten, copper) is formed on the wafer thereafter, and then patterned through photolithography and etching (e.g., dry etching, wet etching), as shown in FIG. 37(a). A cross-sectional view along a cutline "cutline 5" is shown in FIG. 37(b). In some embodiments, a salicidation process is then performed. Another BARC layer is formed as a hard mask, and another photo-resist layer is formed on the BARC layer, as shown in FIG. 38(a). Then, the photo-resist layer is exposed to light and patterned. Part of the photo-resist layer is removed, as shown in FIG. 38(b). The BARC layer is then etched (e.g., through wet etching or dry etching), as shown in FIG. 39(a). Thereafter, the photo-resist layer is removed, as shown in FIG. 39(b).

Figure 40B:
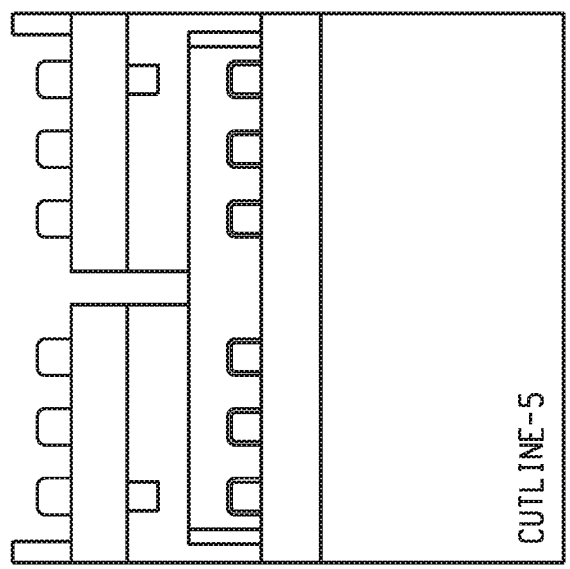
Figure 40A:
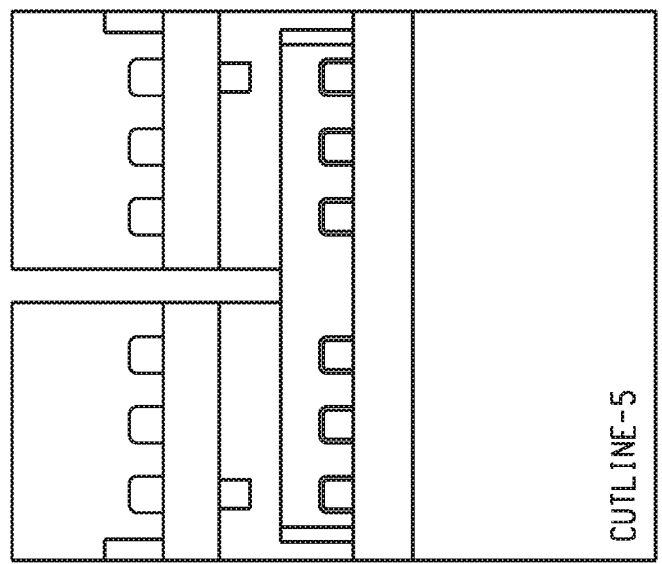
Figure 41:
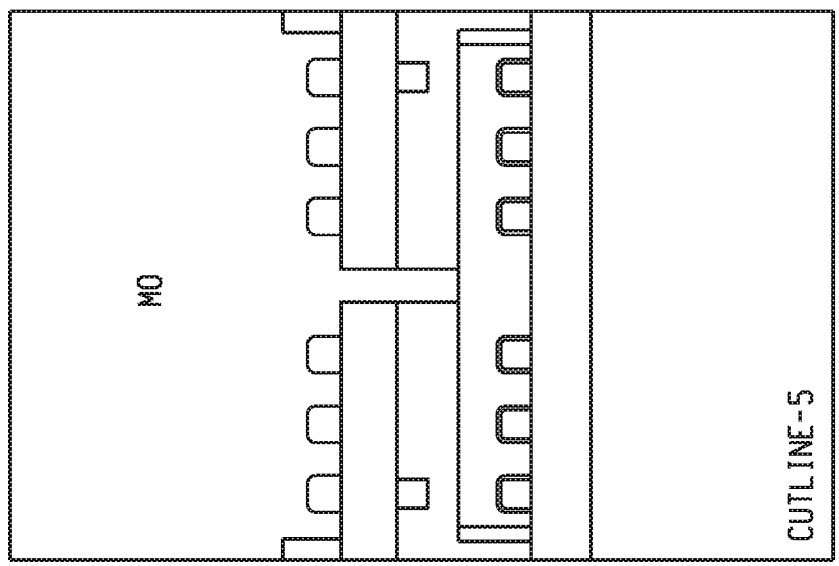
Figure 42B:
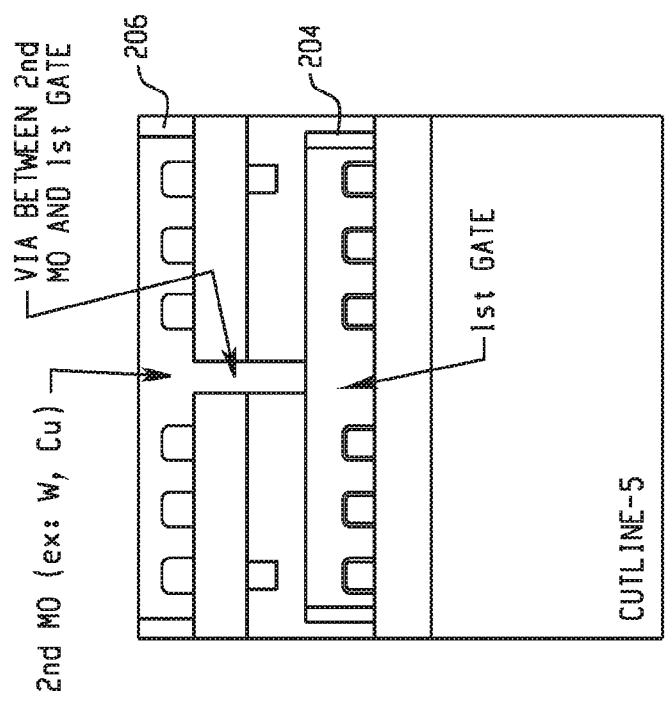
Figure 42A:
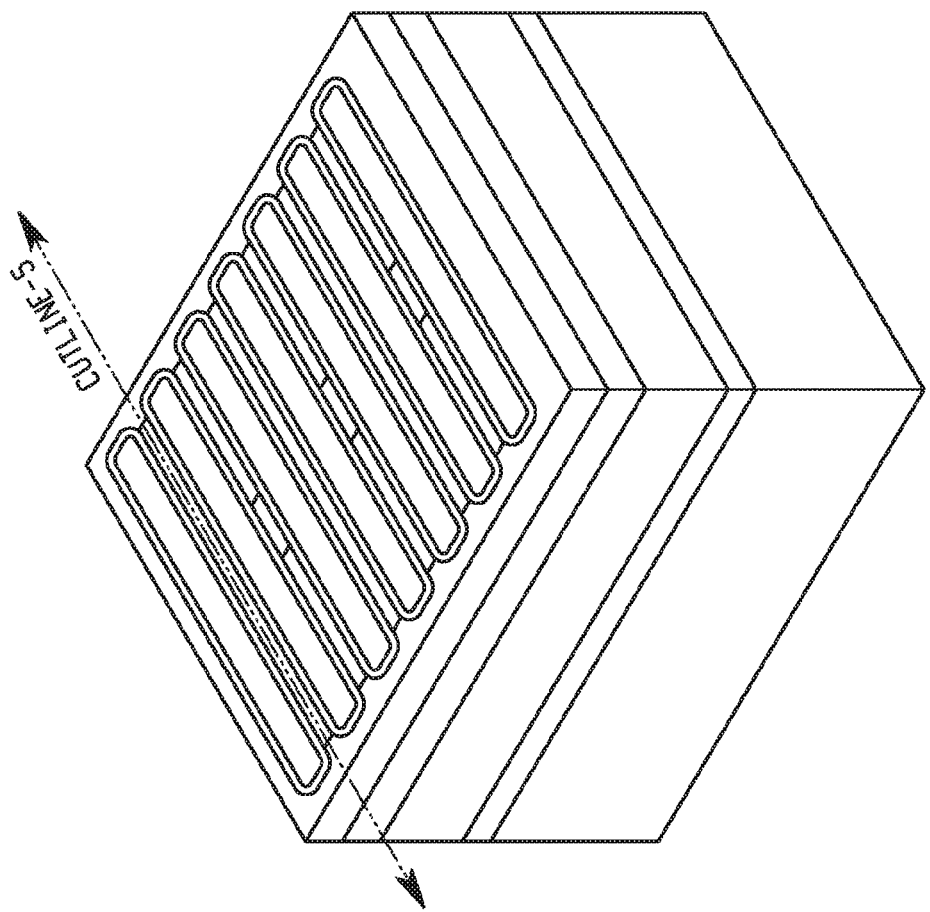

Etching is performed, e.g., through the interfacial layer (e.g., the glue/buffer layer, or the buried oxide layer) and the inter-layer dielectric layer (ILDO), as shown in FIG. 40(a). The BARC layer is then removed, as shown in FIG. 40(b). As shown in FIG. 41, another conductive layer (e.g., tungsten, copper) is formed on the wafer, for example, for the source/drain contacts in the second device layer 206. The conductive layer is then planarized, for example, through CMP, as shown in FIG. 42(a). One or more inter-layer connection structures (e.g., vias) are formed, for example, between the gate structures in the first device layer 204 and the source/drain contacts in the second device layer 206, as shown in FIG. 42(b).

Figure 43B:
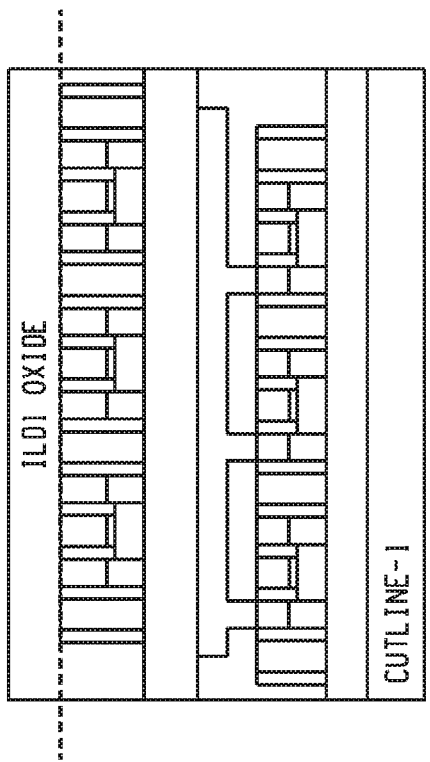
Figure 43C:
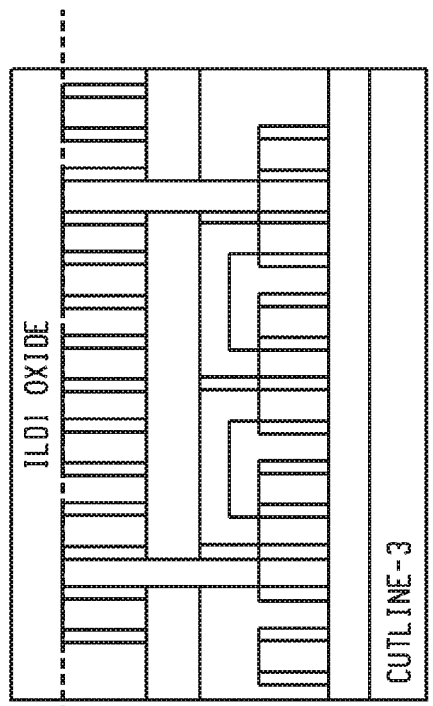
Figure 43A:
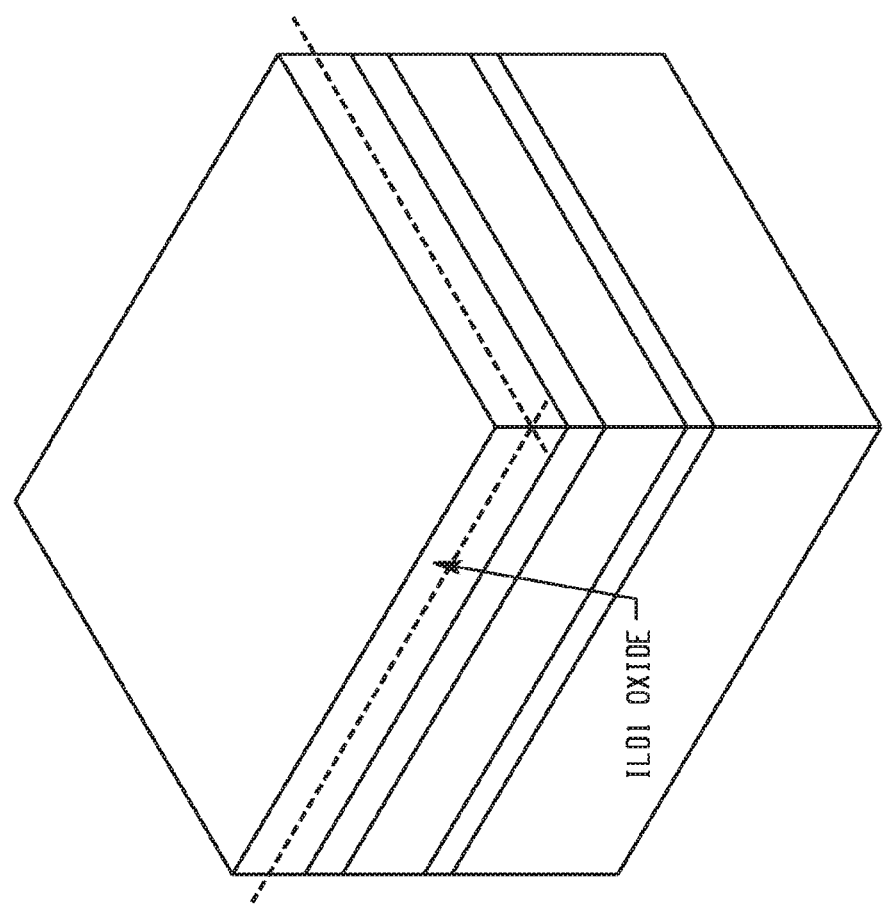

Furthermore, an inter-layer dielectric layer (ILD1) is formed (e.g., through deposition) and planarized (e.g., through CMP, as shown in FIG. 43(a). Cross-sectional views of the wafer along the cutlines "cutline-1" and "cutline-3" are shown in FIG. 43(b) and FIG. 43(c) respectively. As an example, the inter-layer dielectric layer includes silicon oxides.

A hard mask layer (e.g., a CESL layer) is then formed on the inter-layer dielectric layer (ILD1). The CESL layer is then patterned through photolithography and etching (e.g., dry etching, wet etching). Another hard mask layer (e.g., a bottom layer), is formed (e.g., through deposition). The bottom layer is then patterned through photolithography and etching (e.g., dry etching, wet etching). Subsequently, the inter-layer dielectric layer (ILD1) is etched (e.g., through dry etching or wet etching) using the bottom layer as the hard mask. Then, the bottom layer is removed, and the inter-layer dielectric layer (ILD1) is etched (e.g., through dry etching or wet etching) using the CESL layer as the hard mask. For example, a certain thickness (e.g., d) of the inter-layer dielectric layer (ILD1) remains after etching. In some embodiments, the CESL layer is removed thereafter.

Figure 44A:
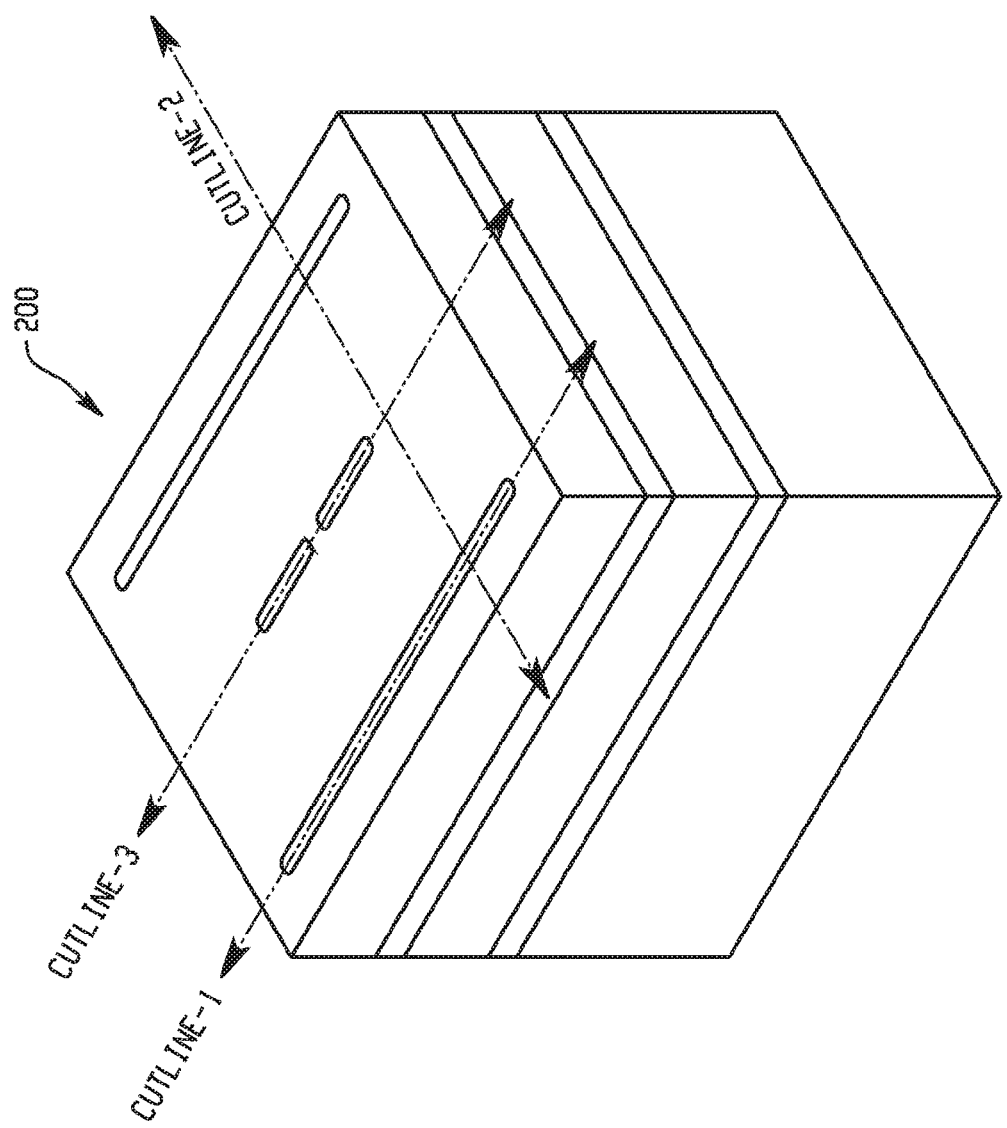
Figures 44B, 44C:
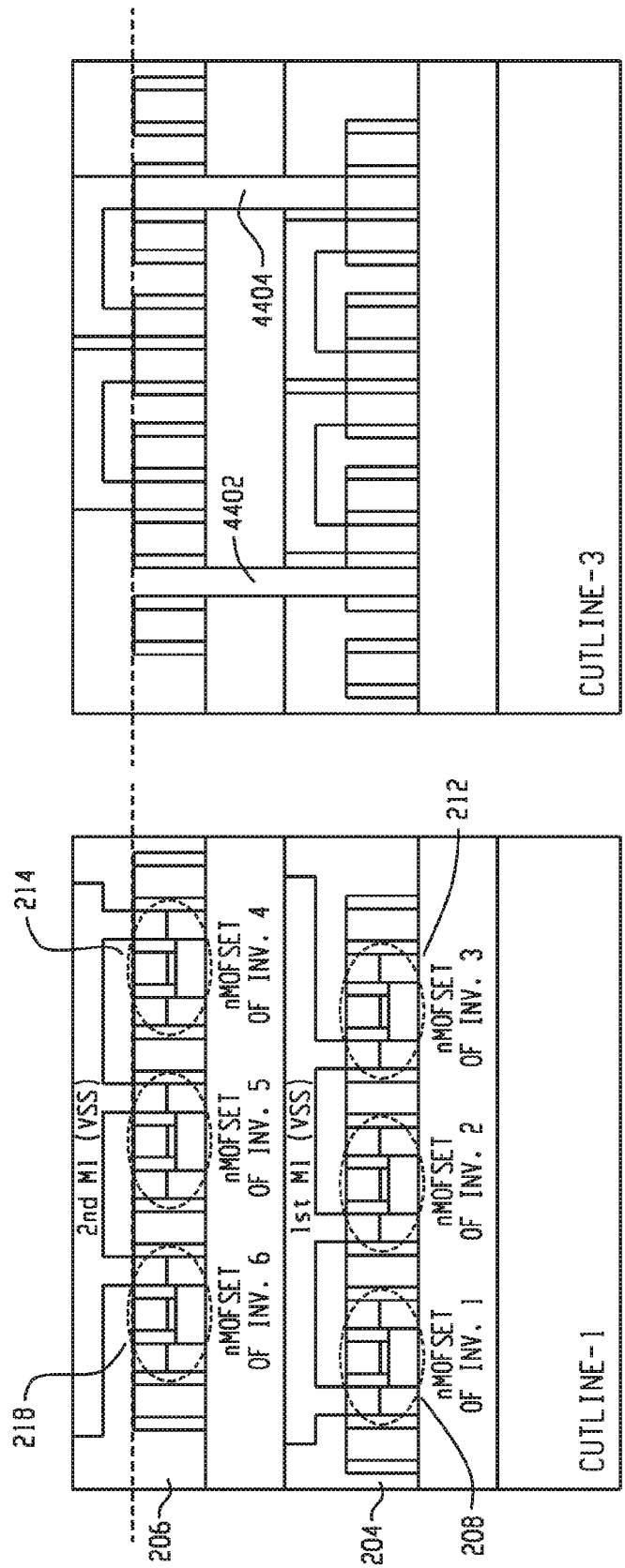

A conductive layer is formed on the wafer and planarized (e.g., through CMP, as shown in FIG. 44(a). Cross-sectional views of the wafer along the cutlines "cutline-1" and "cutline-3" are shown in FIG. 44(b) and FIG. 44(c) respectively. Thus, the inverter chain 202 is formed in the semiconductor structure 200 that includes the first device layer 204 and the second device layer 206. For example, as shown in FIG. 44(b), the gate structures of the inverters in the first device layer 204 and the gate structures of the inverters in the second device layer 206 are interleaved. The transistors (e.g., n-type transistors) in the first device layer 204 and the transistors (e.g., n-type transistors) in the second device layer 206 are interleaved. As an example, an inter-layer connection structure 4402 is disposed to connect the input terminal of the inverter 208 (e.g., In1) to the output terminal of the inverter 218 (e.g., Out6), as shown in FIG. 44(c). Another inter-layer connection structure 4404 is disposed to connect the output terminal of the inverter 212 (e.g., Out3) and the input terminal of the inverter 214 (e.g., In4).

Figure 45:
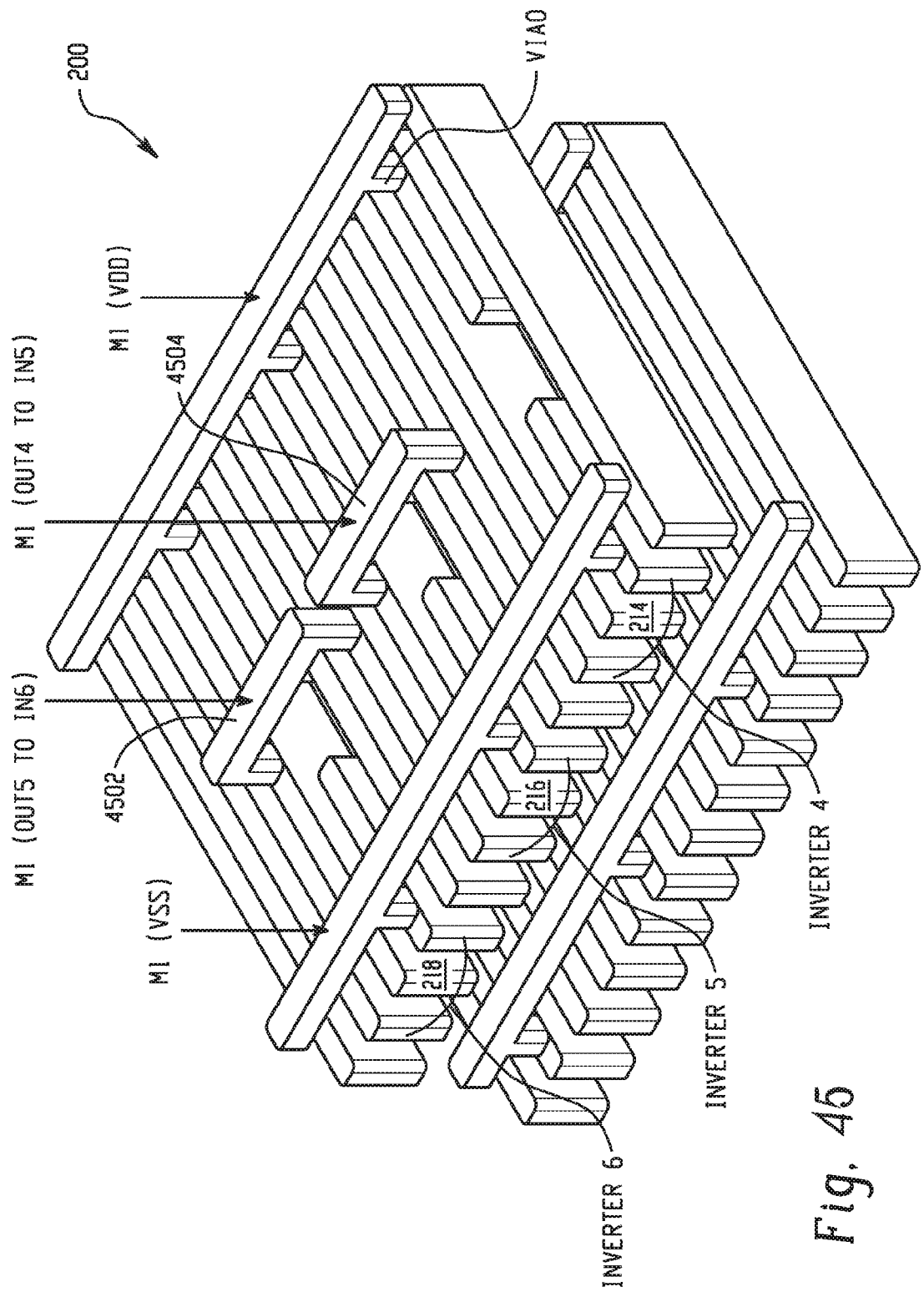
FIG. 45-FIG. 46 depict example diagrams showing certain components of a multi-layer semiconductor structure.
Figure 46:
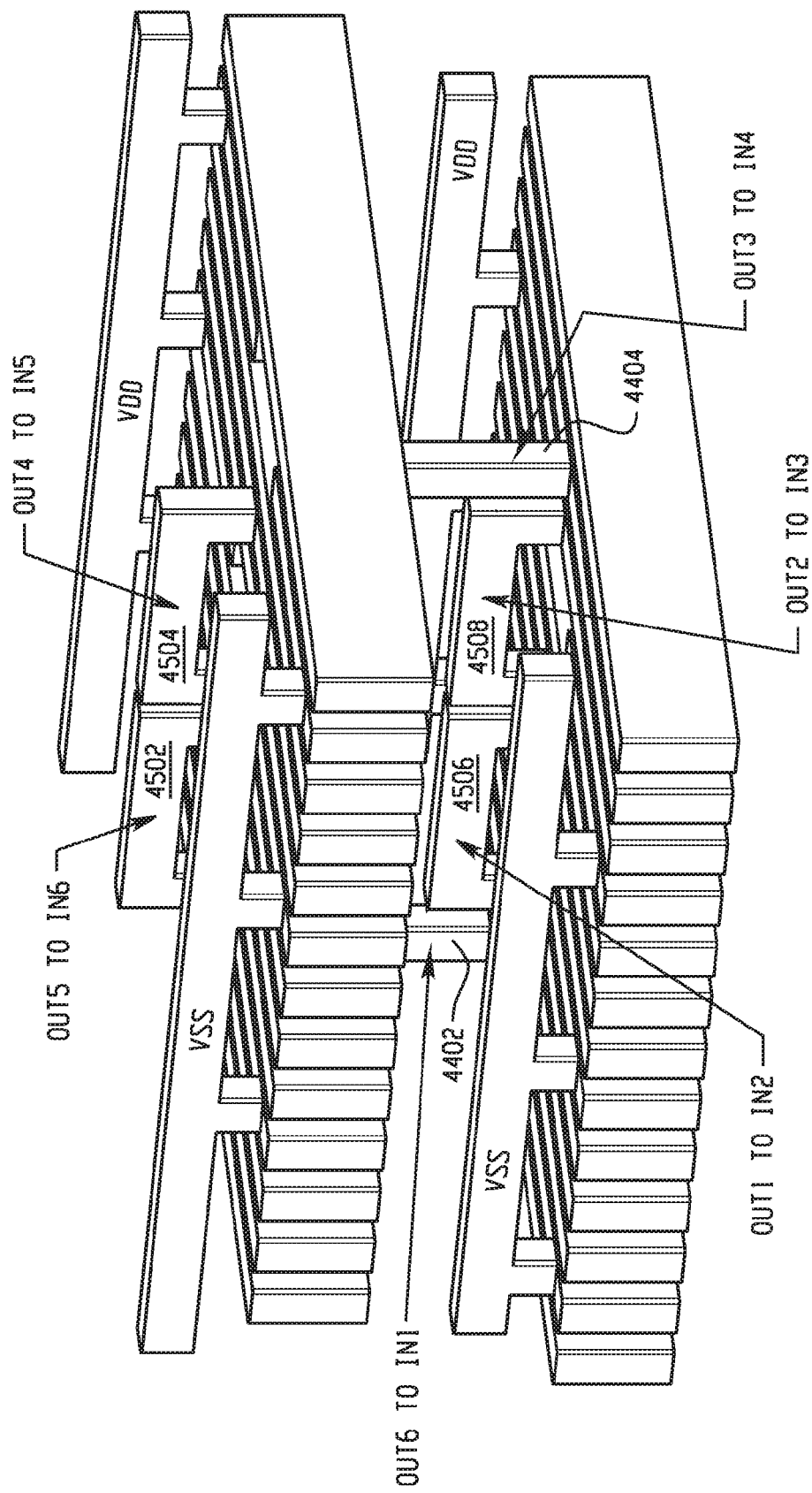

FIG. 45-FIG. 46 depict example diagrams showing certain components of the multi-layer semiconductor structure 200. The inverters 214 and 216 and 218 are formed in the second device layer 206. As shown in FIG. 45 and FIG. 46, a connection structure 4502 is disposed to connect the output terminal of the inverter 216 (e.g., Out5) to the input terminal of the inverter 218 (e.g., In6), and a connection structure 4504 is disposed to connect the output terminal of the inverter 214 (e.g., Out4) to the input terminal of the inverter 216 (e.g., In5). In addition, a connection structure 4506 is disposed to connect the output terminal of the inverter 208 (e.g., Out1) to the input terminal of the inverter 210 (e.g., In2), and a connection structure 4508 is disposed to connect the output terminal of the inverter 210 (e.g., Out2) to the input terminal of the inverter 212 (e.g., In3). The substrate, the buried oxide, the inter-layer dielectric layers, and the spacers are not shown in FIG. 45 and FIG. 46.

Figure 47:
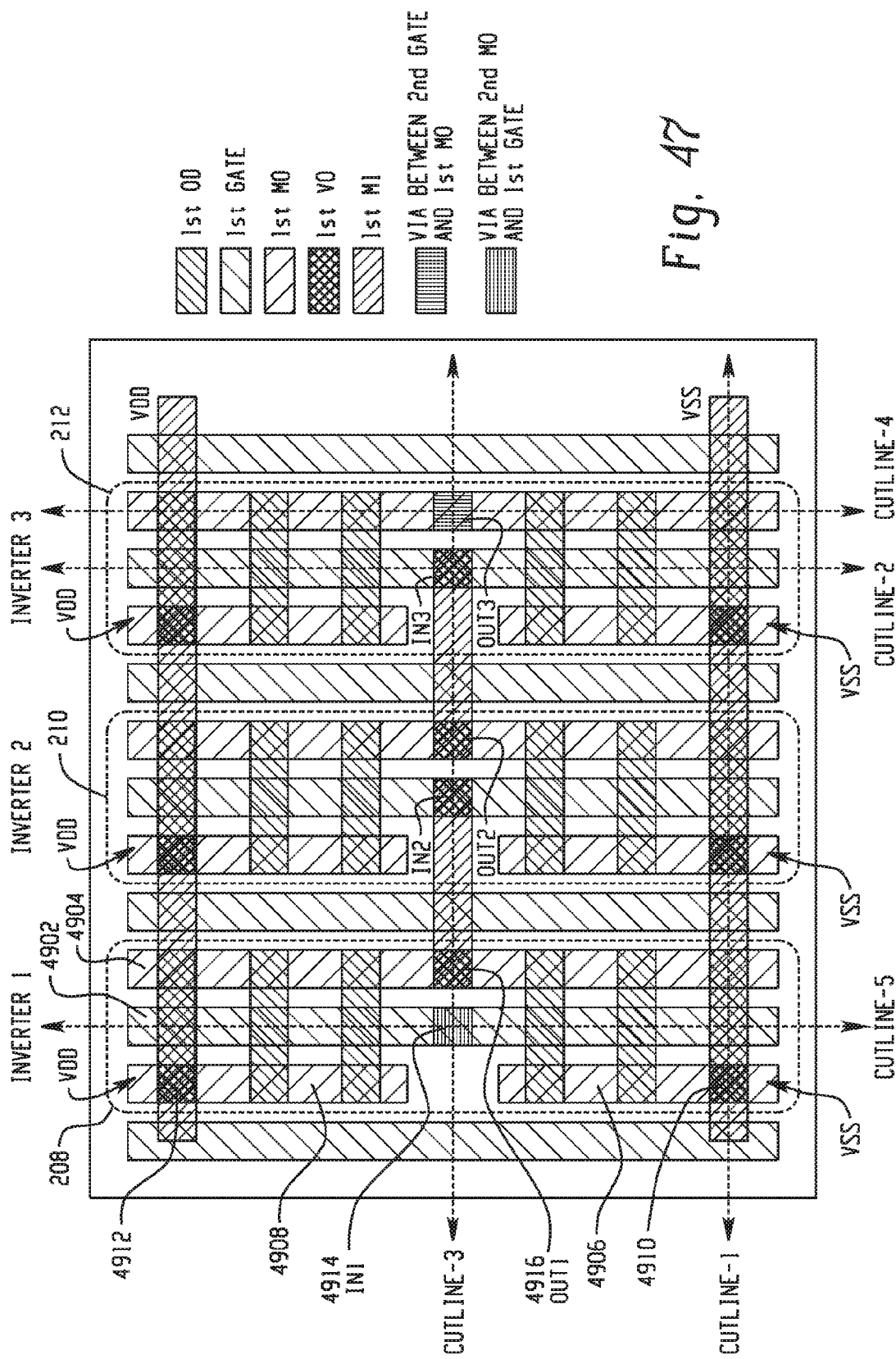
FIG. 47 depicts an example layout diagram of a first device layer of the semiconductor structure as shown in FIG. 2.

FIG. 47 depicts an example layout diagram of the first device layer 204 of the semiconductor structure 200. As shown in FIG. 47, the first device layer 204 includes the inverters 208, 210 and 212. For example, the inverter 208 includes a gate structure 4902, a drain region 4904 and source regions 4906 and 4908. A connection structure 4910 is disposed to electrically connect the source region 4906 to a bias voltage VSS, and another connection structure 4912 is disposed to electrically connect the source region 4908 to another bias voltage VDD. An inter-layer connection structure 4914 (e.g., a via) is disposed to connect to the gate structure 4902 and serves as an input terminal (e.g., In1) of the inverter 208. A connection structure 4916 is disposed to connect to the drain region 4904 and serves as an output terminal (e.g., Out1) of the inverter 208. The inverters 210 and 212 have a similar layout as the inverter 208, as shown in FIG. 47.

Figure 48:
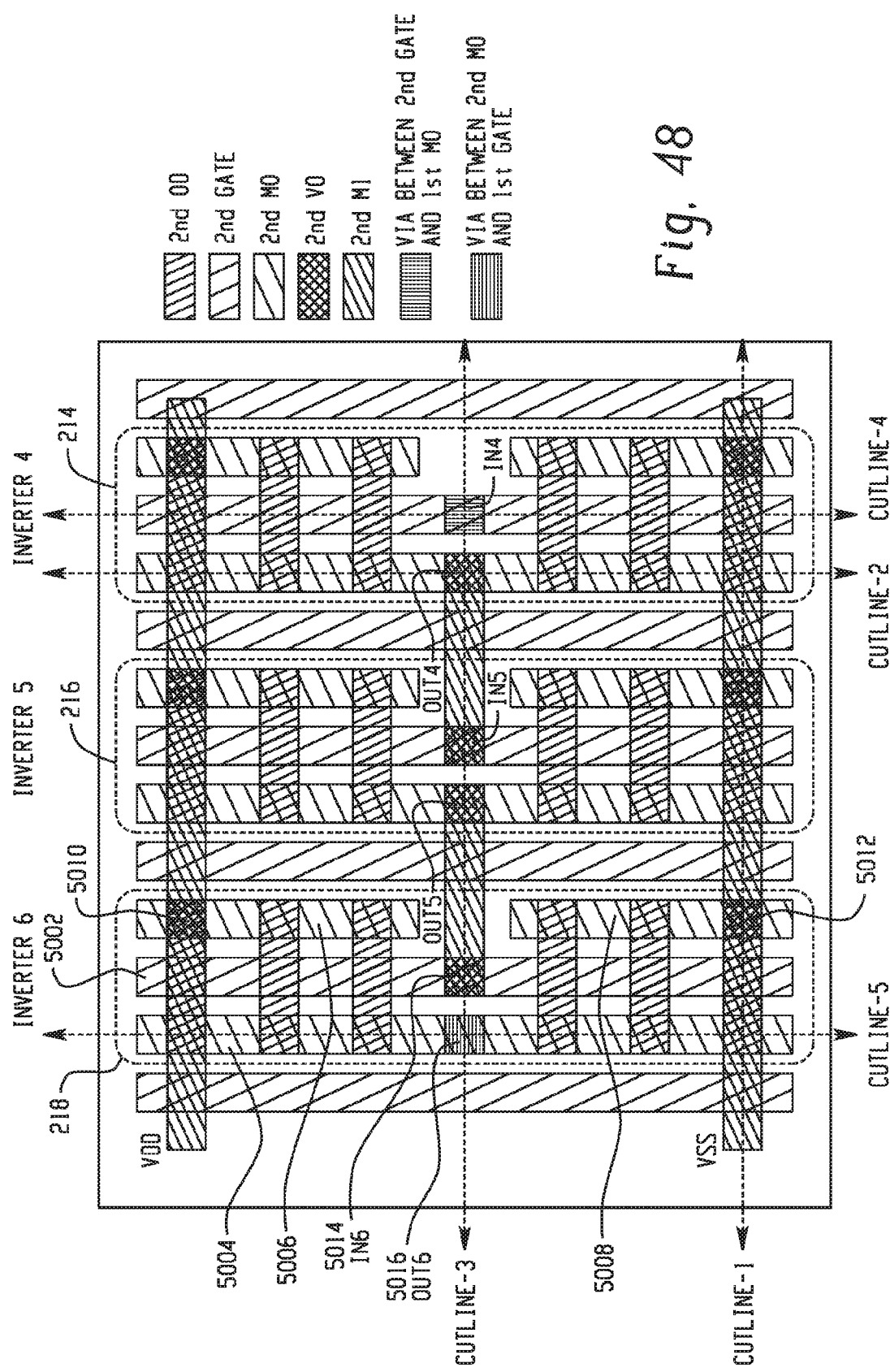
FIG. 48 depicts an example layout diagram of a second device layer of the semiconductor structure as shown in FIG. 2.

FIG. 48 depicts an example layout diagram of the second device layer 206 of the semiconductor structure 200. As shown in FIG. 48, the second device layer 206 includes the inverters 214, 216 and 218. For example, the inverter 218 includes a gate structure 5002, a drain region 5004 and source regions 5006 and 5008. A connection structure 5010 is disposed to electrically connect the source region 5006 to a bias voltage VDD, and another connection structure 5012 is disposed to electrically connect the source region 5008 to another bias voltage VSS. A connection structure 5014 is disposed to connect to the gate structure 5002 and serves as an input terminal (e.g., In6) of the inverter 218. An inter-layer connection structure 5016 is disposed to connect to the drain region 5004 and serves as an output terminal (e.g., Out6) of the inverter 218. The inverters 214 and 216 have a similar layout as the inverter 218, as shown in FIG. 48. For example, the output terminal (e.g., Out6) of the inverter 218 is connected to the input terminal (e.g., In1) of the inverter 208, and the output terminal (e.g., Out3) of the inverter 212 is connected to the input terminal (e.g., In4) of the inverter 214.

Figure 49:
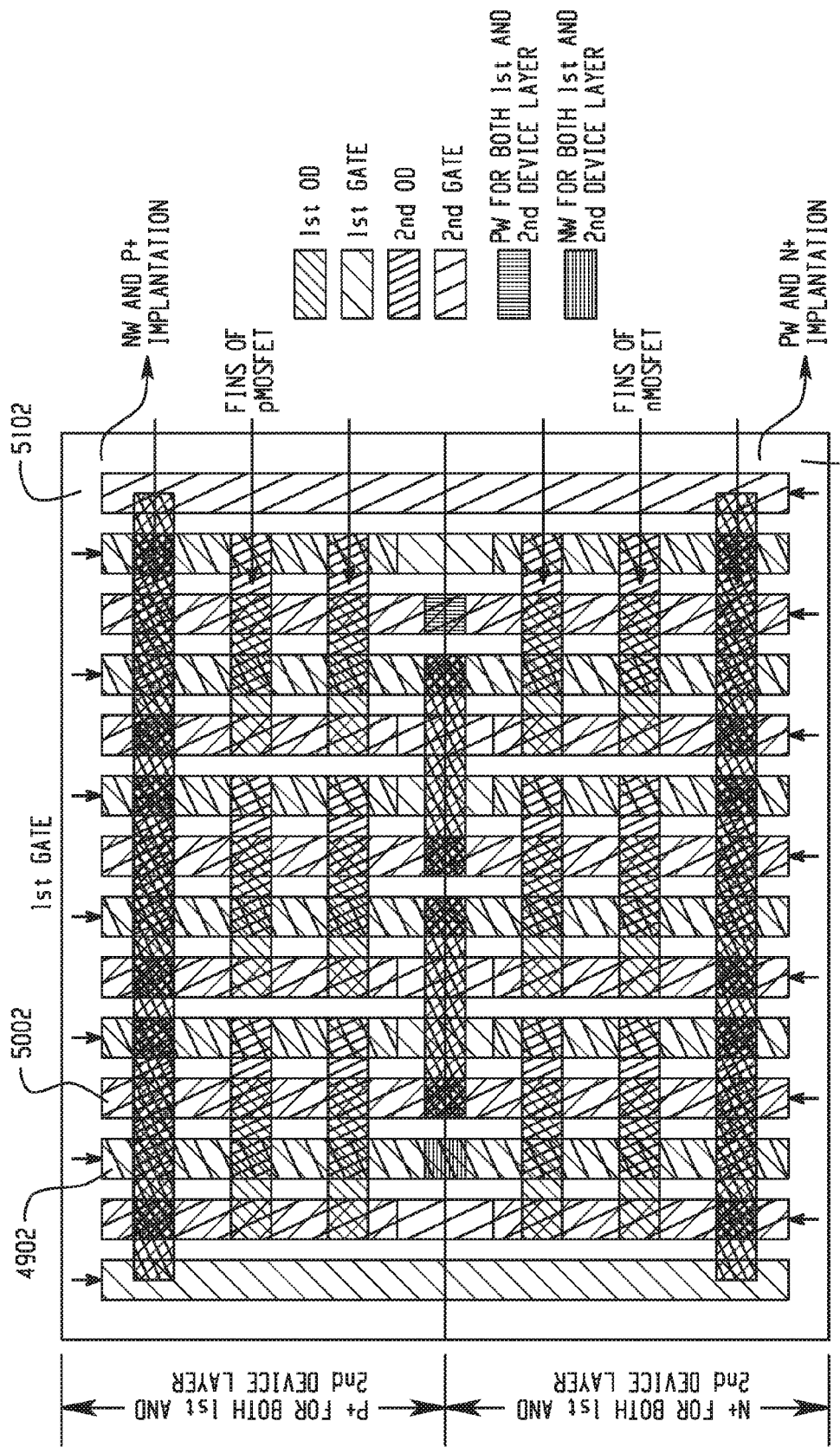
FIG. 49 depicts an example layout diagram of implantation-related layout for both a first device layer and a second device layer of the semiconductor structure as shown in FIG. 2.

FIG. 49 depicts an example layout diagram of implantation-related layout for both the first device layer 204 and the second device layer 206 of the semiconductor structure 200. As shown in FIG. 49, the gate structures (e.g., the gate structure 4902) in the first device layer 204 and the gate structures (e.g., the gate structure 5002) in the second device layer 206 are interleaved. The region 5102 is disposed for n-wells and p+implantation for fabricating the inverters in the device layers 204 and 206, and the region 5104 is disposed for p-wells and n+implantation for fabricating the inverters in the device layers 204 and 206.

Figure 50:
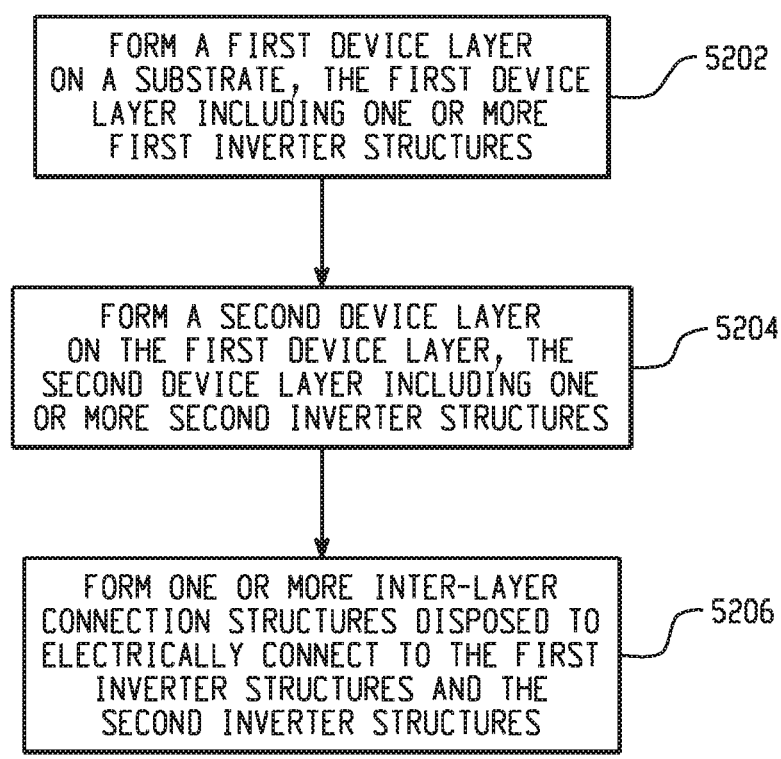
FIG. 50 depicts an example flow chart for fabricating an inverter chain in a multi-layer semiconductor structure.

FIG. 50 depicts an example flow chart for fabricating multiple inverter structures in a multi-layer semiconductor structure. At 5502, a first device layer is formed on a substrate. The first device layer includes one or more first inverter structures. At 5504, a second device layer is formed on the first device layer. The second device layer includes one or more second inverter structures. At 5506, one or more inter-layer connection structures are disposed to electrically connect to the first inverter structures and the second inverter structures.

In some embodiments, the first inverter structures and the second inverter structures are connected in cascade to form an inverter chain. Each inverter structure includes an input terminal and an output terminal. The input terminal of each inverter is connected to the output terminal of a previous inverter in the chain, and the output terminal of each inverter is connected to the input terminal of a next inverter in the chain. At least one of the first inverter structures is connected to one of the second inverter structures through an inter-layer connection structure (e.g., a via). As an example, each inverter structure includes a n-type transistor (e.g., n-MOSFET) and a p-type transistor (e.g., p-MOSFET).

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures. For example, certain transistors are described herein as examples, and the concepts, structures, layouts, materials, or operations may also be applicable to other types of semiconductor devices, such as bipolar junction transistors, diodes, capacitors, etc. As an example, the structures, layouts, materials, operations, voltage levels, or current levels related to "source" and "drain" described herein (including in the claims) may be interchangeable as a result of transistors with "source" and "drain" being symmetrical devices.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as on, in, etc. that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on or over and in immediate contact with the second layer/structure unless such is specifically stated; there may be one or more third layers/structures between the first layer/structure and the second layer/structure. The term "in" used herein (including in the claims) for a situation where a device/component is fabricated "in" a layer/structure does not indicate that all parts of the device/component are completely contained inside the layer/structure unless such is specifically stated; there may be one or more parts of the device/component exist outside of the layer/structure. The term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The term "semiconductor structure" used herein (including in the claims) may refer to shallow trench isolation features, poly-silicon gates, lightly doped drain regions, doped wells, contacts, vias, metal lines, or other types of circuit patterns or features to be formed on a semiconductor substrate. In addition, the term "semiconductor structure" used herein (including in the claims) may refer to various semiconductor devices, including transistors, capacitors, diodes, etc.

What is claimed is:

1. A method for fabricating multiple inverter structures in a multi-layer semiconductor structure, the method comprising:

forming a first device layer on a substrate, the first device layer comprising one or more first inverter structures including a first input terminal and a first output terminal;

forming a second device layer on the first device layer, the second device layer comprising one or more second inverter structures including a second input terminal and a second output terminal; and forming one or more inter-layer connection structures disposed to (i) electrically connect the first input terminal to the second output terminal, and (ii) electrically connect the first output terminal to the second input terminal.

2. The method of claim 1, wherein the substrate includes a silicon wafer and a buried-oxide layer.

3. The method of claim 1, wherein forming the first device layer on the substrate includes:

forming a first channel material layer on the substrate; and forming one or more first fin structures in the first channel material layer, the first fin structures corresponding to the first inverter structures.

4. The method of claim 3, wherein forming the first device layer on the substrate further includes performing well implantation on the first fin structures.

5. The method of claim 3, wherein forming the first device layer on the substrate further includes:

forming a first interfacial dielectric layer on the first fin structures; and forming one or more first gate structures associated with the first inverter structures.

6. The method of claim 3, wherein forming the first device layer on the substrate further includes forming one or more spacers on the first fin structures.

7. The method of claim 3, wherein forming the first device layer on the substrate further includes forming one or more first source regions and one or more first drain regions, the first source regions and the first drain regions being associated with the first inverter structures.

8. The method of claim 3, wherein forming the first device layer on the substrate further includes forming a conductive layer for contacts of the first inverter structures.

9. The method of claim 1, wherein forming the second device layer on the first device layer includes:
   forming a buffer layer on the first device layer;
   forming a second channel material layer on the buffer layer; and
   forming one or more second fin structures in the second channel material layer, the second fin structures corresponding to the second inverter structures.

10. The method of claim 9, wherein forming the second device layer on the first device layer further includes:
    forming a second interfacial dielectric layer on the second fin structures; and
    forming one or more second gate structures associated with the second inverter structures.

11. The method of claim 9, wherein forming the second device layer on the first device layer further includes forming one or more second source regions and one or more second drain regions, the second source regions and the second drain regions being associated with the second inverter structures.

12. A method for fabricating multiple inverter structures in a multi-layer semiconductor structure, the method comprising:
    forming a first device layer on a substrate, the first device layer comprising one or more first inverter structures including a first input terminal and a first output terminal;
    forming a second device layer on the first device layer, the second device layer comprising one or more second inverter structures including a second input terminal and a second output terminal;
    forming a first inter-layer connection structure disposed to electrically connect to the first input terminal and the second output terminal; and
    forming a second inter-layer connection structure disposed to electrically connect to the second input terminal and the first output terminal.

13. The method of claim 12, wherein forming the first device layer on the substrate includes:
    forming a first channel material layer on the substrate; and
    forming one or more first fin structures in the first channel material layer, the first fin structures corresponding to the first inverter structures.

14. The method of claim 13, wherein forming the first device layer on the substrate further includes performing well implantation on the first fin structures.

15. The method of claim 13, wherein forming the first device layer on the substrate further includes:
    forming a first interfacial dielectric layer on the first fin structures; and
    forming one or more first gate structures associated with the first inverter structures.

16. The method of claim 13, wherein forming the first device layer on the substrate further includes forming one or more spacers on the first fin structures.

17. The method of claim 12, wherein forming the second device layer on the first device layer includes:
    forming a buffer layer on the first device layer;
    forming a second channel material layer on the buffer layer; and
    forming one or more second fin structures in the second channel material layer, the second fin structures corresponding to the second inverter structures.

18. The method of claim 17, wherein forming the second device layer on the first device layer further includes:
    forming a second interfacial dielectric layer on the second fin structures; and
    forming one or more second gate structures associated with the second inverter structures.

19. The method of claim 17, wherein forming the second device layer on the first device layer further includes forming one or more second source regions and one or more second drain regions, the second source regions and the second drain regions being associated with the second inverter structures.

20. A method for fabricating multiple inverter structures in a multi-layer semiconductor structure, the method comprising:
    forming a first device layer on a substrate, the first device layer comprising one or more first inverter structures corresponding to one or more first fin structures, the one or more first inverter structures including a first input terminal and a first output terminal;
    forming a second device layer on the first device layer, the second device layer comprising one or more second inverter structures corresponding to one or more second fin structures, the one or more second inverter structures including a second input terminal and a second output terminal; and
    forming one or more inter-layer connection structures disposed to (i) electrically connect the first input terminal to the second output terminal, and (ii) electrically connect the first output terminal to the second input terminal.

* * * * *